(12) United States Patent
Sugahara et al.

(10) Patent No.: US 11,694,731 B2
(45) Date of Patent: Jul. 4, 2023

(54) SEMICONDUCTOR STORAGE DEVICE AND METHOD OF CONTROLLING THE SAME

(71) Applicant: KIOXIA CORPORATION, Tokyo (JP)

(72) Inventors: Akio Sugahara, Yokohama (JP);
Yoshikazu Harada, Kawasaki (JP);
Shoichiro Hashimoto, Kawasaki (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/864,515

(22) Filed: Jul. 14, 2022

(65) Prior Publication Data
US 2022/0351760 A1 Nov. 3, 2022

Related U.S. Application Data

(63) Continuation of application No. 17/203,455, filed on Mar. 16, 2021, now Pat. No. 11,423,961, which is a continuation of application No. 16/838,091, filed on Apr. 2, 2020, now Pat. No. 10,991,402, which is a continuation of application No. 16/298,525, filed on Mar. 11, 2019, now Pat. No. 10,650,869, which is a continuation of application No. 15/702,881, filed on Sep. 13, 2017, now Pat. No. 10,276,221.

(30) Foreign Application Priority Data

Mar. 17, 2017 (JP) ................ 2017-053632

(51) Int. Cl.
G11C 5/14 (2006.01)
G11C 7/10 (2006.01)
G11C 7/22 (2006.01)
G11C 5/02 (2006.01)

(52) U.S. Cl.
CPC ............ *G11C 7/1063* (2013.01); *G11C 5/025* (2013.01); *G11C 7/222* (2013.01)

(58) Field of Classification Search
CPC ........ G11C 5/025; G11C 7/222; G11C 7/1063
USPC ....................................................... 365/227
See application file for complete search history.

(56) References Cited

U.S. PATENT DOCUMENTS 8,861,298 B2 10/2014 Shibata
8,908,463 B1 12/2014 Fukuda
9,443,600 B2 9/2016 Ghalam et al.
(Continued)

FOREIGN PATENT DOCUMENTS

JP 2008-197807 8/2008
JP 2012-138158 7/2012
JP 2016-514323 5/2016

*Primary Examiner* — Vu A Le
(74) *Attorney, Agent, or Firm* — Oblon, McClelland, Maier & Neustadt, L.L.P.

(57) ABSTRACT

In one embodiment, a semiconductor storage device includes a plurality of memory chips, at least one of the memory chips including a first controller configured to be shifted to a wait state of generating a peak current, before generating the peak current in accordance with a command. The device further includes a control chip including a second controller configured to search a state of the first controller and control, based on a result of searching the state of the first controller, whether or not to issue a cancel instruction for the wait state to the first controller that has been shifted to the wait state.

20 Claims, 23 Drawing Sheets

(56) References Cited

U.S. PATENT DOCUMENTS

| | | |
|---|---|---|
| 9,601,206 B2 | 3/2017 | Shibata et al. |
| 2008/0192548 A1 | 8/2008 | Shibata |
| 2012/0063234 A1 | 3/2012 | Shiga |
| 2012/0140583 A1 | 6/2012 | Chung |
| 2012/0320682 A1 | 12/2012 | Shibata |
| 2014/0029357 A1* | 1/2014 | Lee ................. G11C 16/30 365/189.11 |
| 2014/0063973 A1* | 3/2014 | Shibata ............ G11C 16/08 365/185.18 |
| 2014/0075133 A1 | 3/2014 | Li |
| 2014/0192583 A1 | 7/2014 | Rajan |
| 2014/0192606 A1 | 7/2014 | Kang et al. |
| 2016/0077961 A1 | 3/2016 | Erez et al. |

\* cited by examiner

| DATA BUS VALUE | STATE |
|---|---|
| 0000 | Ready |
| 0001 | Busy (Not Peak Wait) |
| 0010 | Read |
| 0011 | Peak Wait in Read |
| 0100 | Peak Wait in Program |
| 0101 | Peak Wait in Program Verify |
| 0110 | Peak Wait in Erase Verify |
| 0111~1111 | Peak Wait in XXX |

| Din | DETAILS |
|---|---|
| Enable | PEAK CTRL |
| Read Enable | APPLY PEAK CTRL to Read |
| Program Enable | APPLY PEAK CTRL to Program |
| Erase Enable | APPLY PEAK CTRL to Erase |
| Read Chip Number | UPPER LIMIT VALUE OF NUMBER OF OVERLAPPING CHIPS during Read |
| Busy Chip Number | REFERENCE VALUE REGARDING TRANSITION to wait state |
| Chip Number | MAXIMUM NUMBER OF PEAK CURRENTS |

SEMICONDUCTOR STORAGE DEVICE AND METHOD OF CONTROLLING THE SAME

CROSS REFERENCE TO RELATED APPLICATION

This application is a continuation of and claims the benefit of priority from U.S. application Ser. No. 17/203,455, filed Mar. 16, 2021, which is a continuation of U.S. application Ser. No. 16/838,091 (now U.S. Pat. No. 10,991,402) filed on Apr. 2, 2020, which is a continuation of U.S. application Ser. No. 16/298,525 (now U.S. Pat. No. 10,650,869), filed on Mar. 11, 2019, which is a continuation of U.S. application Ser. No. 15/702,881 (now U.S. Pat. No. 10,276,221), filed on Sept. 13, 2017, which is based upon and claims the benefit of priority from the prior Japanese Patent Application No. 2017-053632, filed on Mar. 17, 2017; the entire contents of which are incorporated herein by reference.

FIELD Embodiments described herein relate to a semiconductor storage device and a method of controlling the same.

BACKGROUND

A semiconductor storage device including plural memory chips is known.

DETAILED DESCRIPTION

Figure 1:
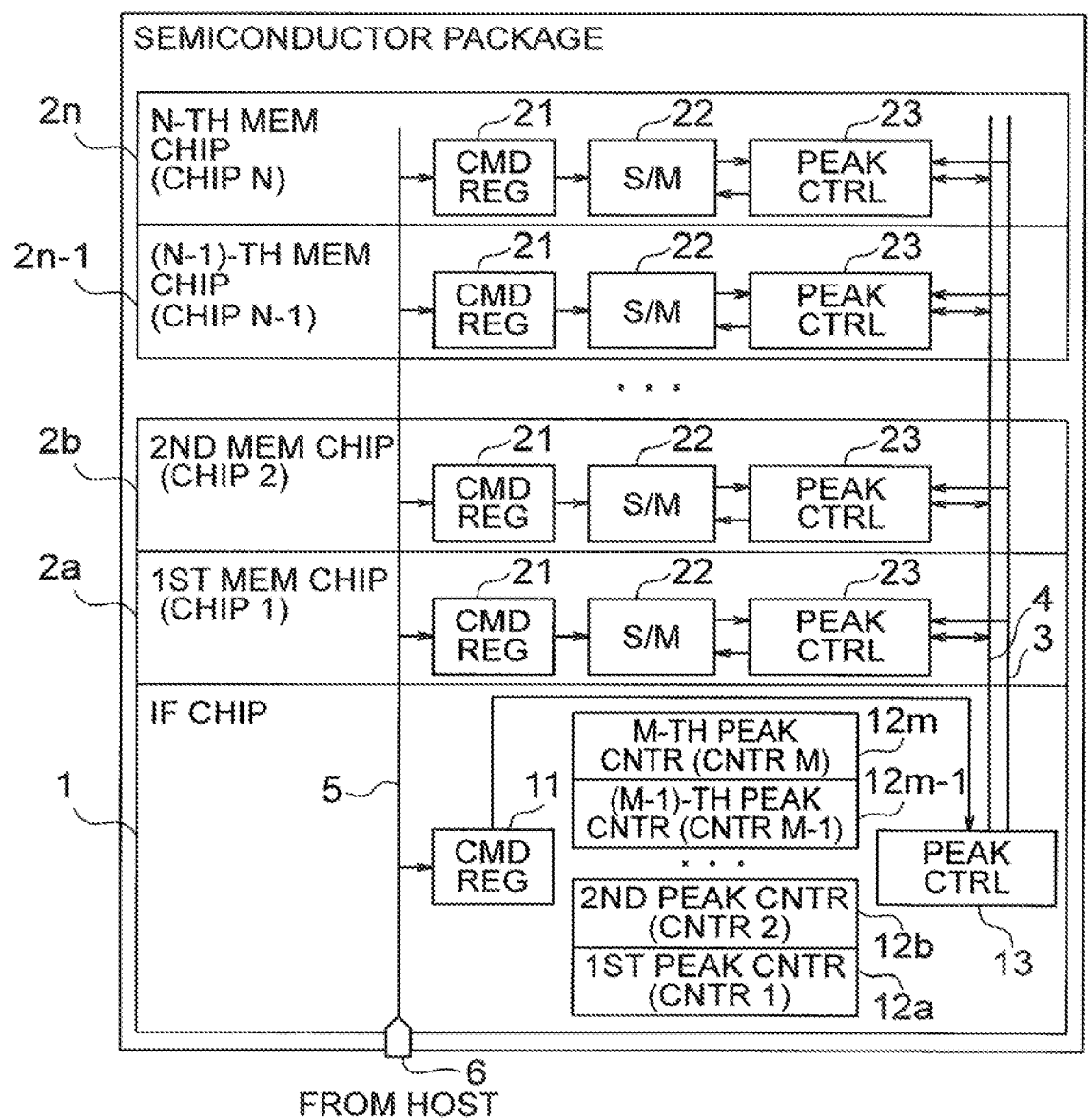
FIG. 1 is a block diagram illustrating a configuration of a semiconductor storage device of a first embodiment.

Embodiments will now be explained with reference to the accompanying drawings. In FIGS. 1 to 28, the same or similar components are denoted by the same reference numerals, and overlapping explanations thereof are omitted.

In one embodiment, a semiconductor storage device includes a plurality of memory chips, at least one of the memory chips including a first controller configured to be shifted to a wait state of generating a peak current, before generating the peak current in accordance with a command. The device further includes a control chip including a second controller configured to search a state of the first controller and control, based on a result of searching the state of the first controller, whether or not to issue a cancel instruction for the wait state to the first controller that has been shifted to the wait state.

First Embodiment

FIG. 1 is a block diagram illustrating a configuration of a semiconductor storage device of a first embodiment.

A semiconductor storage device in FIG. 1 includes n interface (IF) chip 1 as an example of a control chip, first to N-th memory chips 2a to 2n in which N represents an integer of 2 or greater, a dock bus 3, a data bus 4, an external access channel 5 and a pad 6.

Examples of the semiconductor storage device in FIG. 1 include an electrically rewritable nonvolatile memory such as a NAND flash memory having a multi-chip configuration. The IF chip 1 and the first to N-th memory chips 2a to 2n are stacked on one another so as to be contained in the same semiconductor package. Hereinafter, each of the first to N-th memory chips 2a to 2n is referred to as "memory chip 2", as appropriate. The first to N-th memory chips 2a to 2n are referred to as "chips 1 to N", respectively, as appropriate.

The IF chip 1 is a semiconductor chip that controls operations and communication of the memory chips 2. The IF chip 1 includes a command register 11, first to M-th peak counters 12a to 12m in which M represents an integer of 2 or greater, and a peak controller 13. The command register 11 and the peak controller 13 are an example of a first controller. Hereinafter, each of the first to M-th peak counters 12a to 12m is referred to as "peak counter 12", as appropriate. The first to M-th peak counters 12a to 12m are referred to as "counters 1 to M", respectively, as appropriate.

Each of the memory chips 2 is a semiconductor chip capable of functioning as a memory, and includes a command register 21, a state machine 22 and a peak controller 23. The command register 21, the state machine 22, and the peak controller 23 are an example of a second controller. The memory chips 2 are referred to as core chips, in some cases.

Through the clock bus 3, a clock signal is transmitted from the IF chip 1 to each of the memory chips 2. Through the data bus 4, a data signal is transmitted/received to/from the IF chip 1 and each of the memory chips 2. Through the external access channel 5, a command from an external host is inputted to the semiconductor storage device via the pad 6. The clock bus 3, the data bus 4, and the external access channel 5 are each formed of a through silicon via (TSV) electrode (described later), and allow fast information exchange among the chips.

Each of the memory chips 2 receives, from the host, command regarding an operation such as Program (writing), Read (reading out), Erase (deleting). Each of the memory chips 2, for example, writes, reads, or deletes data according to the received command. As a result, a peak current is generated. When peak currents generated by the plurality of memory chips 2 overlap with one another, the total peak current in the package may become excessive. For this reason, the IF chip 1 and the memory chips 2 each perform peak current control (PCC) for controlling such overlapping by means of the functional block group illustrated In FIG. 1.

The command register 11 of the IF chip 1 receives a command from the host via the external access channel 5. For example, a command regarding an operation such as Program, Read, or Erase is received. When receiving a command regarding an operation for which peak control is required, the command register 11 starts up the peak controller 13.

Each of the peak counters 12 generates a count value corresponding to a time period during which a peak current is generated from a memory chip 2. Specifically, prior to generation of a peak current from one of the memory chips 2, the memory chip 2 outputs, to the IF chip 1, peak-wait notification data about a wait state in which the memory chip 2 is waiting for permission of generation of a peak current. Thereafter, one of the peak counters 12 is started up. After being started up, the peak counter 12 generates a count value corresponding to a time period during which the peak current is generated.

When only one peak counter 12 among the first to M-th peak counters 12a to 12m has been started up to operate, the remaining M−1 peak counters 12 are available counters. In this state, when the IF chip 1 receives peak-wait notification data, any one of the available counters is then started up. As a result, two of the first to M-th peak counters 12a to 12m are in operation, and count values corresponding to respective time periods, during which two peak currents are generated from two memory chips 2, are generated.

The number M of the peak counters 12 in the present embodiment is set to the maximum number of peak currents which are permitted to overlap with one another in the semiconductor storage device. That is, the semiconductor storage device of the present embodiment permits at most M overlapping peak currents to be generated. Therefore, the first to M-th peak counters 12a to 12m can simultaneously generate count values corresponding to respective time periods during which the M peak currents are generated.

The peak controller 13 of the IF chip 1 includes a state machine having a Search state, a Go state, and the like, and includes a bus controller that controls the data bus 4. For example, the peak controller 13 in the Search state searches the states of the first to N-th memory chips 2a to 2n by sequentially patrolling the first to N-th memory chips 2a to 2n. Further, the peak controller 13 in the Go state issues a Go instruction (a cancel instruction) to a memory chip 2 that is in a wait state (a waiting state) so as to permit the memory chip 2 to execute an operation such as Program, Read, and Erase. The memory chip 2 having received the Go instruction executes the permitted operation. As a result, a peak current is generated. The peak controller 13 of the present embodiment serves as a host for the data bus 4, so as to specify any one of the memory chips 2, specify transmission/reception to be performed through the data bus 4, execute processing of data received from the memory chips 2, perform transmission control of a Go instruction to the memory chips 2, and the like.

The command register 21 of each of the memory chips 2 receives a command from the host via the external access channel 5. For example, a command regarding an operation such as Program, Read, or Erase is received. When receiving a command from the host, the command register 21 starts up the corresponding state machine 22.

The state machine 22 controls various operations of the corresponding memory chip 2. For example, immediately before the memory chip 2 generates a peak current in accordance with a command, the state machine 22 is shifted to the wait state to wait for permission to generate a peak current. When the state machine 22 in the wait state receives a Go instruction from the IF chip 1 via the data bus 4, the state machine 22 is shifted to a state in which the state machine 22 can generate a peak current. As a result, an operation regarding the command is executed, so that a peak, current is generated.

The peak controller 23 of each of the memory chips 2 controls transmission/reception through the data bus 4 and executes processing of data received through the data bus 4. For example, when the first memory chip 2a is specified, and then, receives a transmission request for data transmission from the IF chip 1, the peak controller 23 of the first memory chip 2a transmits data regarding the transmission request to the IF chip 1 through the data bus 4. Examples of such data include notification data that is outputted, when the state machine 22 is shifted to the wait state, for notification about the peak waiting. Further, when the first memory chip 2a is specified, and then, receives a reception request for data reception from the IF chip 1, the peak controller 23 of the first memory chip 2a receives data regarding the reception request from the IF chip 1 through the data bus 4. Examples of such data include data indicative of a Go instruction.

Figure 2:
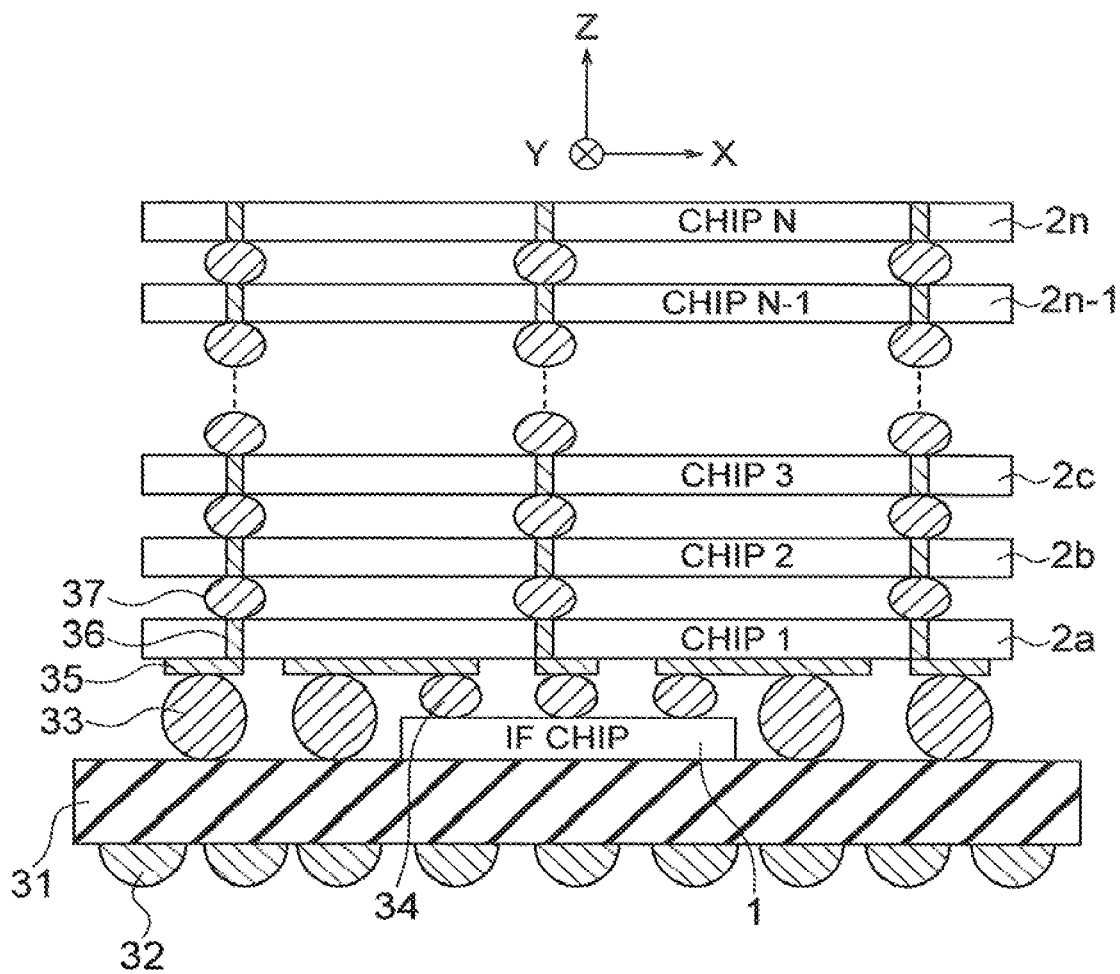
FIG. 2 is a cross-sectional view illustrating the configuration of the semiconductor storage device of the first embodiment.

FIG. 2 is a cross-sectional view illustrating the configuration of the semiconductor storage device of the first embodiment.

The semiconductor storage device of the present embodiment includes a substrate 31, bumps 32, large bumps 33, microbumps 34, a rewiring layer 35, TSV electrodes 36, and bumps 37, in addition to the IF chip 1, the memory chips 2, and the like.

In FIG. 2, an X direction and a Y direction respectively represent directions parallel to a surface of the substrate 31 and perpendicular to each other, and a Z direction represents a direction perpendicular to the surface of the substrate 31. The +Z direction and the −Z direction are the upward direction and the downward direction herein, respectively. However, the −Z direction does not need to be the same as the gravity direction.

The bumps 32 are provided on the lower surface of the substrate 31, and are used for electrical connection between the semiconductor storage device and an external host or the like. On the other hand, the IF chip 1 is provided on the upper surface of the substrate 31, and the memory chips 2 (the first to N-th memory chips 2a to 2n) are stacked on the IF chip 1.

The large bumps 33 are disposed on the upper surface of the substrate 31, and the microbumps 34 are disposed on the upper surface of the IF chip 1. The rewiring layer 35 is formed on the lower surface of the first memory chip 2a. Consequently, the first memory chip 2a is positioned above the substrate 31 via the large bumps 33, the microbumps 34, and the rewiring layer 35.

The TSV electrodes 36 are provided in the memory chips 2 so as to be exposed on the upper and lower surfaces of the memory chips 2. The memory chips 2 each include a semiconductor substrate such as a silicon substrate and at least one layer provided on the semiconductor substrate. Each of the TSV electrodes 36 may include a penetrating electrode penetrating through the semiconductor substrate and the layer of the corresponding memory chip 2, or may include a penetrating electrode penetrating through only the semiconductor substrate of the corresponding memory chip 2. In the latter case, each of the TSV electrodes 36 is formed of the penetrating electrode and a wiring of a multi-layer wiring layer. The N-th memory chip 2n at the uppermost layer may include no TSV electrode 36.

As a result of stacking of the first to N-th memory chips 2a to 2n on one another, the TSV electrodes 36 are positioned so as to electrically connect the first to N-th memory chips 2a to 2n to one another. In FIG. 2, the memory chips 2 are electrically connected to one another via the bumps 37. Further, the memory chips 2 are electrically connected to the IF chip 1 and the bumps 32 via the large bumps 33, the microbumps 34, the rewiring layer 35, the TSV electrodes 36, and the bumps 37.

The aforementioned dock bus 3, the aforementioned data bus 4, and the aforementioned external access channel 5 are formed of the bumps 32, the large bumps 33, the microbumps 34, the rewiring layer 35, the TSV electrodes 36, and the bumps 37.

Figure 3:
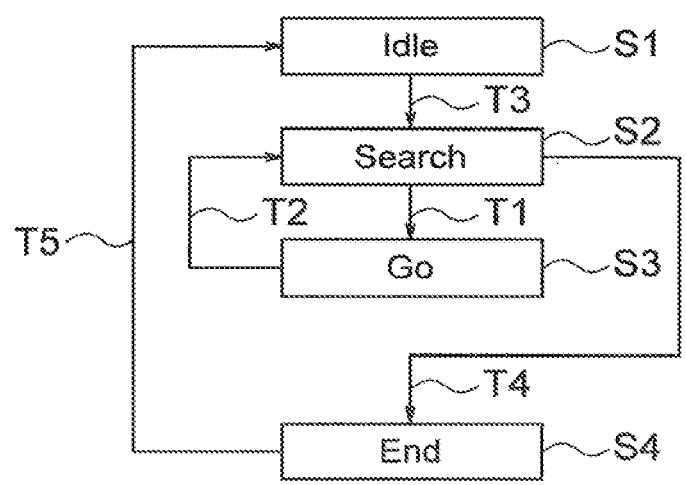
FIG. 3 is a state transition diagram regarding an operation of a peak controller in an IF chip of the first embodiment.

FIG. 3 is a state transition diagram regarding an operation of the peak controller 13 in the IF chip 1 of the first embodiment The peak controller 13 can enter an Idle state (S1), a Search state (S2), a Go state (S3), and an End state (S4). The state of the peak controller 13 can be shifted as indicated by arrows T1 to T5.

In the Idle state, operations to be subjected to peak control are not executed at any of the memory chips 2. In the present embodiment, such operations to be subjected to peak control include Program, Read, and Erase.

In the Search state, the, peak controller 13 sequentially patrols the memory chips 2 to search the states of the memory chips 2. As a result, the peak controller 13 succeeds to acquire internal information (e.g., peak waiting) of the memory chips 2.

In the Go state, a Go instruction is issued to any one of the memory chips 2 that is in the wait state, such that an operation such as Program, Read, or Erase is permitted. The peak controller 13 of the present embodiment controls whether or not to issue a Go instruction to a memory chip 2 in the wait state based on the result of search executed during the Search state.

In the End state, peak control is ended since operations to be subjected to peak control have been ended at all the memory chips 2.

For example, the peak controller 13 operates as follows.

When the IF chip 1 receives a command regarding an operation for which peak control is required, the state of the peak controller 13 is shifted from the Idle state to the Search state (T3), and the peak controller 13 starts to search the states of the memory chips 2.

The peak controller 13 searches the first to N-th memory chips 2a to 2n, sequentially one by one. Specifically, the search to determine whether or not each of the memory chips 2 is in the wait state is executed using peak-wait notification data.

When receiving notification data about peak waiting, the peak controller 13 checks whether or not the first to M-th peak counters 12a to 12m include an available peak counter. When the result shows that the peak counters 12 include an available peak counter, the state of the peak controller 13 is shifted from the Search state to the Go state (T1) such that the peak controller 13 issues a Go instruction to the memory chip 2 having outputted the peak-wait notification data. Then, the state of the peak controller 13 is returned from the Go state to the Search state (T2), and the peak controller 13 continues to patrol other memory chips 2. When the Go instruction is inputted to the memory chip 2 in the wait state, an operation regarding the command is executed so that a peak current is generated.

Meanwhile, when issuing a Go instruction, the peak controller 13 causes any one of the peak counters 12 to start generating a count value corresponding to a time period during which a peak current is generated, such that peak controller 13 apprehends the peak-current generation status. When the count value generated by the peak counter 12 has not reached a predetermined value, the peak controller 13 determines that a peak current is being generated. When the count value generated by the peak counter 12 has reached the predetermined value, the peak controller 13 determines that generation of the peak current is completed. As described later, the peak controller 13 controls issuance of a Go instruction based on the count value generated by the peak counter 12.

When all the memory chips 2 have completed the operations to be subjected to peak control, the peak controller 13 is shifted from the Search state to the End state (T4). Then, the peak controller 13 is shifted from the End state to the Idle state (T5).

Figures 4, 5:
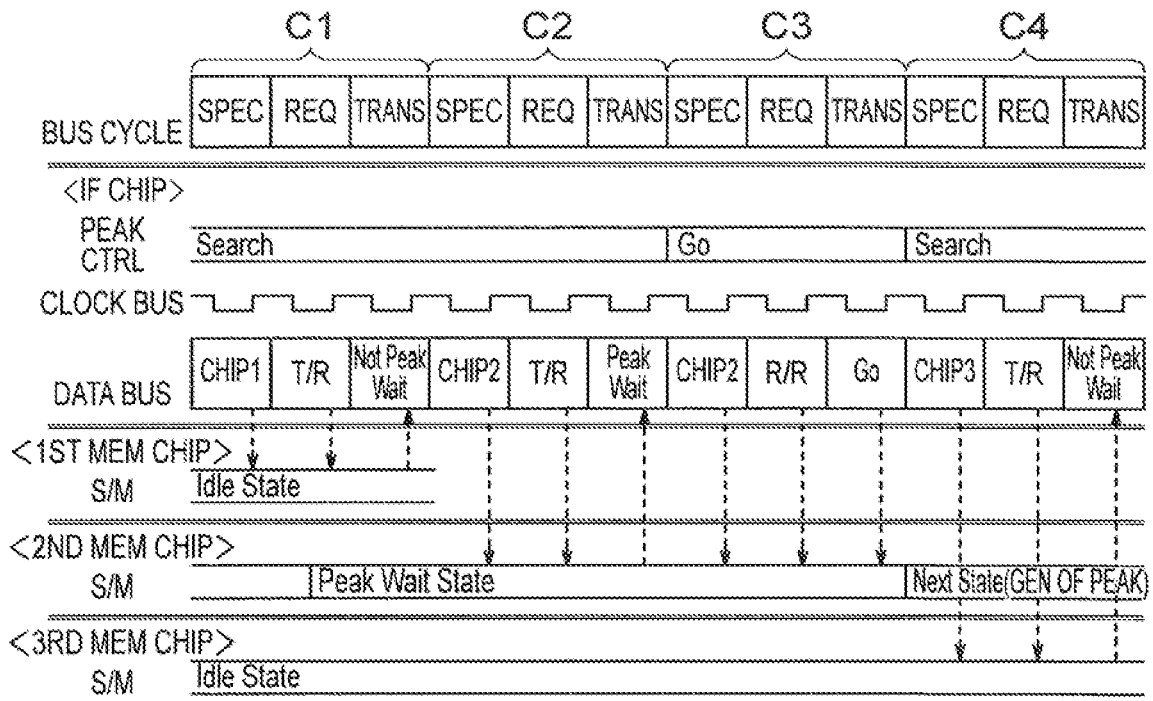
FIG. 4 is a timing chart showing operations of the semiconductor storage device of the first embodiment.
FIG. 5 is a table showing an example of data transferred from a memory chip to the IF chip of the first embodiment.

FIG. 4 is a timing chart showing operations of the semiconductor storage device of the first embodiment.

FIG. 4 shows that time-changes in the state of the peak controller 13 of the IF chip 1, a clock signal in the clock bus 3, a data signal in the data bus 4, and the states of the state machines 22 of the first to third memory chips 2a to 2c. Reference characters C1 to C4 each represent a bus cycle for one of the memory chips 2. Each of the bus cycles is composed of a period of chip specification, a time period of a request for reception/transmission of core data, and a time period of data transfer. In the semiconductor storage device, information is exchanged based on the protocol shown in FIG. 3

At the cycle C1, the peak controller 13 is in the Search state, specifies the first memory chip 2a, and transmits a transmission request for data transmission from the first memory chip 2a. As a result, the peak controller 13 recognizes that (the state machine 22 of) the first memory chip 2a is not in the wait state of waiting for permission to generate a peak current, but in the idle state of riot waiting for permission to generate a peak current.

At the cycle C2, the peak controller 13 is also in the Search state, specifies the second memory chip 2b, and transmits a transmission request for data transmission from the second memory chip 2b. As a result, the peak controller 13 recognizes that the second memory chip 2b is in the wait state. Here, the peak counters 12 are assumed to include an available peak counter. The peak controller 13 is shifted from the Search state to the Go state.

At the cycle C3, the peak controller 13 is in the Go state, specifies the second memory chip 2b again in order to issue a Go instruction, and transmits a reception request for data reception by the second memory chip 2b. The peak controller 13 issues a Go instruction to the second memory chip 2b, and the second memory chip 2b receives the Go instruction and is shifted to a state of generating a peak current. After issuing the Go instruction, the peak controller 13 returns from the Go state to the Search state.

At the cycle C4, the peak controller 13 in the Search state, specifies the third memory chip 2c, and transmits a transmission request for data transmission from the third memory chip 2c. As a result, the peak controller 13 recognizes that the third memory chip 2c is in the idle state. In this way, patrol is carried out by the peak controller 13.

FIG. 5 is a table showing an example of data transferred from the memory chips 2 to the IF chip 1 of the first embodiment. The IF chip 1 controls operations of each memory chip 2 based on such data.

For example, the bus value "0000" of the data bus 4 indicates a Ready state in which the memory chip 2 in question is not executing an operation for which peak control is required, and is equivalent to an example of the idle state in FIG. 4. The bus value "0001" indicates a Busy state (however, excluding a Peak_Wait state) in which the memory chip 2 is executing an operation. The bus value "0010" indicates a Read state in which the memory chip 2 is executing an operation "Read". The bus value "0010" is used in a fifth embodiment (described later). The bus value "0011" indicates a Peak_Wait state in which the memory chip 2 waits for permission to generate a peak current while executing an operation "Read", and is equivalent to an example of the wait state in FIG. 4, etc.

The bus value "0100" indicates a Peak_Wait state in which the memory chip 2 waits for permission to generate a peak current while executing an operation "Program". The bus value "0101" indicates a Peak_Wait state in which the memory chip 2 waits for permission to generate a peak current while executing an operation "Program Verify". The bus value "0110" indicates a Peak_Wait state in which the memory chip 2 waits for permission to generate a peak current while executing an operation "Erase Verify". The bus values "0111" to "1111" each indicate a Peak_Wait state in which the memory chip 2 waits for permission to generate a peak current while executing another operation. These bus values are also equivalent to examples of the wait state in FIG. 4, etc.

A master which controls the data bus 4 of the present embodiment exists in the IF chip 1, and the memory chips 2 transmit and receive data such as the aforementioned transmission request and reception request, through the data bus 4 in accordance with an instruction from the master. Examples of data transferred from the memory chips 2 to the IF chip 1 are shown in FIG. 5.

As described above with reference to FIGS. 1 to 5, the state machine 22 of each of the memory chips 2 is shifted to the wait state before generating a peak current in accordance with a command from the host. Further, the peak controller 13 of the IF chip 1 searches the states of the state machines 22 of the memory chips 2, and controls whether or not to issue an instruction (Go instruction) for canceling a wait-state based on the search result.

The peak controller 13 can issue cancel instructions such that peak-current generation timings are different among the memory chips 2. This can reduce overlapping peak currents. In addition, as a result of controlling issuance of cancel instructions based on the search result obtained by the peak controller 13 itself, the peak controller 13 can perform cancelling control without depending on a cancel command from an external host. Accordingly, interruption and restart of data in/data out (see a second embodiment) due to a cancel command can be avoided.

Therefore, according to the present embodiment, deterioration in performance of the memory chips 2 can be suppressed while peak currents generated by the plurality of memory chips 2 are inhibited from overlapping with one another.

Second Embodiment

Figure 6:
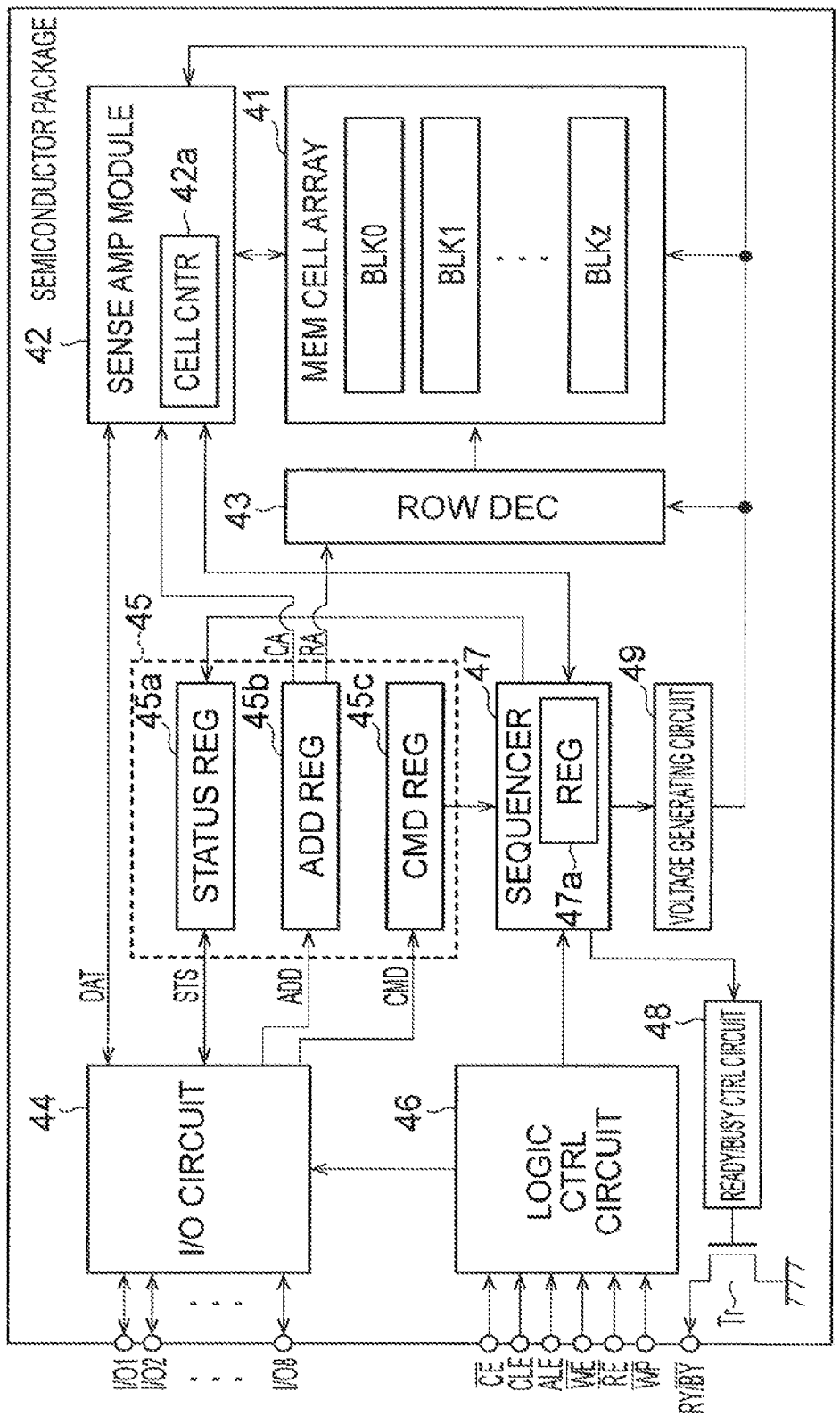
FIG. 6 is a block diagram illustrating a configuration of a semiconductor storage device of a second embodiment.

FIG. 6 is a block diagram illustrating a configuration of a semiconductor storage device of a second embodiment.

The configuration of the semiconductor storage device of the present embodiment is the same as that illustrated in FIG. 1. The above explanation using FIGS. 1 to 5 applies to the semiconductor storage device of the present embodiment. The same applies to third to tenth embodiments (described later). The semiconductor storage device of the present embodiment further includes a configuration illustrated in FIG. 6.

The semiconductor storage device of the present embodiment includes a memory cell array 41, a sense amplifier module 42, and a row decoder 43, which are provided in each of the memory chips 2, and includes an input/output (I/O) circuit 44, a register module 45, a logic control circuit 46, a sequencer 47, a ready/busy control circuit 48, and a voltage generating circuit 49, which are provided in the IF chip 1. These blocks include a block having an overlap with any of the functional blocks in FIG. 1 and a block having no overlap with any of the functional blocks in FIG. 1.

The memory cell array 41 includes blocks BLK0 to BLKz (z is an integer of 1 or greater). Each of the blocks BLK0 to BLKz includes a plurality of memory cells associated with a bit line and a word line, and is used as a data erasure unit, for example. Each of the memory cells can store multiple-bit data by using a multi-level cell system.

The sense amplifier module 42 outputs data DAT read out from the memory cell array 41, to an external host via the input/output circuit 44. Further, the sense amplifier module 42 transfers written data DAT received from the external host via the input/output circuit 44, to the memory cell array 41.

The sense amplifier module 42 includes a cell counter 42a, and a plurality of sense amplifier units (not illustrated) provided for respective bit lines. The cell counter 42a counts the number of ON cells of the read-out data, and transfers the count result of the number of ON cells to the sequencer 47.

The row decoder 43 selects a word line corresponding to a memory cell on which a read-out (Read) operation or a writing (Program) operation is to be executed. Further, the row decoder 43 applies desired voltages onto the selected word line and non-selected lines.

The input/output circuit 44 transmits/receives 8-bit width input/output signals I/O (I/O1 to I/O8) to/from the host. For example, the input/output circuit 44 transfers the written data DAT included in an input/output signal I/O from the host to the sense amplifier module 42. Further, the input/output circuit 44 transmits, as an input/output signal I/O, the read-out data DAT from the sense amplifier module 42 to the host. The register module 45 includes a status register 45a, an address register 45b, and a command register 45c. The status register 45a holds status information STS, and transfers the status information STS to the input/output circuit 44 in accordance with an instruction from the sequencer 47. The address register 45b holds address information ADD received from the input/output circuit 44, and transfers a column address signal CA and a row address signal RA included in the address information ADD to the sense amplifier module 42 and the row decoder 43, respectively. The command register 45c holds a command CMD received from the input/output circuit 44, and transfers the command CMD to the sequencer 47.

The logic control circuit 46 receives various control signals from the host so as to control the input/output circuit 44 and the sequencer 47. Examples of such control signals include a chip enable signal /CE, a command latch enable signal CLE, an address latch enable signal ALE, a write enable signal /WE, a read enable signal /RE, and a write protect signal /WP.

A chip enable signal /CE is a control signal to enable the semiconductor storage device. A command latch enable signal CLE is a control signal to notify, to the input/output circuit 44, that a signal inputted to the semiconductor storage device in parallel to the asserted command latch enable signal CLE is a command CMD. An address latch enable signal ALE is a control signal to notify, to the input/output circuit 44, that a signal inputted to the semiconductor storage device in parallel to the asserted address latch enable signal ALE is address information ADD. A write enable signal /WE and a read enable signal/RE are control signals to instruct the input/output circuit 44 to input and output an input/output signal I/O, respectively. A write protect signal /WP is a control signal to set the semiconductor storage device into a protection state when the power is turned on or off, for example.

The sequencer 47 controls operations of the entire semiconductor storage device. Specifically, the sequencer 47 controls the sense amplifier module 42, the row decoder 43, the voltage generating circuit 49, and the like based on a command CMD from the command register 45c so as to control a data writing operation and a data read-out operation. In addition, the sequencer 47 can calculate an optimum correction value for a read-out voltage based on a result of multiple read-out operations using different read-out voltages.

The sequencer 47 includes a register 47a. For example, the register 47a can hold parameters regarding voltage to be applied to the word line during a read-out operation. The sequencer 47 controls a read-out operation with reference to the parameters. The parameters held in the register 47a are rewritable.

The ready/busy control circuit 48 generates a ready/busy signal RY/ (/BY) based on the operating state of the sequencer 47, and transmits the ready/busy signal RY/ (/BY) to the host. The ready/busy signal RY/ (/BY) is a signal for notifying, to the host, about whether the semiconductor storage device is in the Ready state or in the Busy state. In the Ready state, the semiconductor storage device receives an instruction from the host. In the Busy state, the semiconductor storage device does not receive any instruction from the host. The ready/busy signal RY/ (/BY) is generated by the ready/busy control circuit 48 controlling the on/off of a transistor Tr, which is connected to the output of the ready/busy control circuit 48. For example, the ready/busy signal RY/ (/BY) is set to a low (L) level when the semiconductor storage device is executing an operation such as a data read-out operation (the Busy state), and the ready/busy signal RY/ (/BY) is set to a high (H) level when the operation is completed (the Ready state).

The voltage generating circuit 49 generates a desired voltage based, on an instruction from the sequencer 47. The voltage generating circuit 49 supplies the generated voltage to the memory cell array 41, the sense amplifier module 42, and the row decoder 43.

Figures 7, 8:
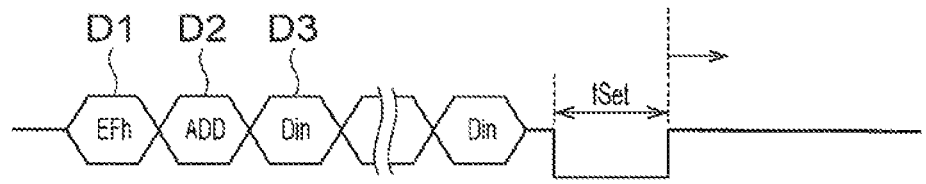
FIG. 7 is a diagram illustrating an example of a command sequence of the second embodiment.
FIG. 8 is a table showing operations of the semiconductor storage device of the second embodiment.

FIG. 7 is a diagram illustrating an example of a command sequence of the second embodiment. FIG. 7 illustrates, as an example, a command sequence during a read-out operation.

First, the host issues a parameter setting command "EFh", and transmits the parameter setting command "EFh" to the semiconductor storage device (D1), The parameter setting command "EFh" is a command for instructing the semiconductor storage device to change parameters, and is equivalent to an example of the aforementioned command CMD. The parameter setting command "EFh" is also referred to as "Set Feature command".

Next, the host issues address information "ADD" and transmits the address information "ADD" to the semiconductor storage device (D2). The address information "ADD" is a signal for specifying an address corresponding to a parameter to be changed.

Next, the host outputs setting data "Din" to the semiconductor storage device over a plurality of cycles (D3). The setting data "Din" corresponds to a parameter for change, and is equivalent to an example of the aforementioned data DAT.

The parameter setting command "EFh" the address information "ADD", and the setting data "Din" are inputted sequentially, as input/output signals I/O, from the host to the input/output circuit 44.

When receiving the parameter setting command, the semiconductor storage device changes the operating mode of the semiconductor storage device in accordance with the command. For example, a correction value for a read-out voltage held in the semiconductor storage device is changed based on an optimize read-out voltage calculated by the host. In FIG. 7, tSet represents a time period during which this changing process is executed, In this time period, the semiconductor storage device is in the Busy state. That is, in a case where the operating mode of the semiconductor storage device is changed through this changing process, and then, a command set for instruction of shift read using the above correction value is issued, the semiconductor storage device is temporally in the Busy state prior to execution of retry read.

FIG. 8 is a table showing operations of the semiconductor storage device of the second embodiment.

FIG. 8 shows examples of the setting data "Din" which is inputted subsequently to the parameter setting command "EFh". The host inputs the parameter setting command "EFh", the address information "ADD" regarding this command, and the setting data "Din" regarding this command sequentially to the semiconductor storage device via the external access channel 5. A user of the semiconductor storage device can change the parameters in the semiconductor storage device by using the parameter setting command.

Setting data "Enable" is data for enabling peak control. Setting data "Read_Enable", setting data "Program_E- nable", and setting data "Erase_Enable" are for determining, when peak control is enabled, whether or not to apply the peak control to Read, Program, or Erase, respectively. Usage examples of such data are described in a fifth embodiment.

Setting data "Read_Chip_Number" is used in the fifth embodiment in which when Read operations are not to be subjected to peak control, the number of the available peak counters 12 is increased and decreased according to the number of overlapping Read operations. This data is data for, when a plurality of the memory chips 2 execute overlapping Read operations, setting the upper limit value of the number of memory chips (the number of the memory chips 2) that are allowed to execute overlapping read operations. Specifically, when the number of the memory chips executing Read is greater than the number indicated by "Read_Chip_Number", the number of the memory chips that are allowed to simultaneously generate peak currents is reduced. A usage example of this data is described in the fifth embodiment.

Setting data "Busy_Chip_Number" is a reference value for limiting the number of the memory chips 2 in the Busy state. Specifically, until the number of the memory chips 2 in the Busy state reaches the reference value, the state machine 22 of each of the memory chips 2 immediately generates a peak current without being shifted to the wait state before generating a peak current. Whether or not the state machine 22 of each of the memory chips 2 immediately generate a peak current is controlled according to a signal "Peak_Wait_Enable" (described later) (see a sixth embodiment). In the Busy state, the memory chip 2 in question is executing an operation. A usage example of this data is described in the sixth embodiment.

Setting data "Chip_Number" is data for setting a maximum number of the memory chips which are permitted to generate overlapping peak currents in the semiconductor storage device. For example, the number of the peak counters 12 included in the IF chip 1 may be eight (M=8). In this case, when the value of this setting data is set to 4, the maximum number of the memory chips that are permitted to generate overlapping peak currents can be reduced from 8 to 4. Examples of such an operation to which this setting data can be applied include Program, Read, and Erase. A usage example of this setting data is described in a fourth embodiment.

As described above, the parameter setting command can change various parameters in the semiconductor storage device. For example, when the setting data "Read_Enable", "Program_Enable", or "Erase_Enable" is used, an operation to be subjected to peak control or an operation not to be subjected to peak control can be selected. The parameter changing process is executed in accordance with the parameter setting command from the host. The IF chip 1 controls the semiconductor storage device by using the changed parameters.

For example, a case where the setting data "Read_Enable" is applied and the setting data "Program_Enable" is not applied is assumed. The state machine 22 of each of the memory chips 2 is shifted to the wait state before generating a peak current based on Read, but is not shifted to the wait state before generating a peak current by Program. The information about such application and non-application of the setting data is transferred to the memory chips 2 by the sequencer 47 (FIG. 5) based on the parameter setting command.

Third Embodiment

Figure 9:
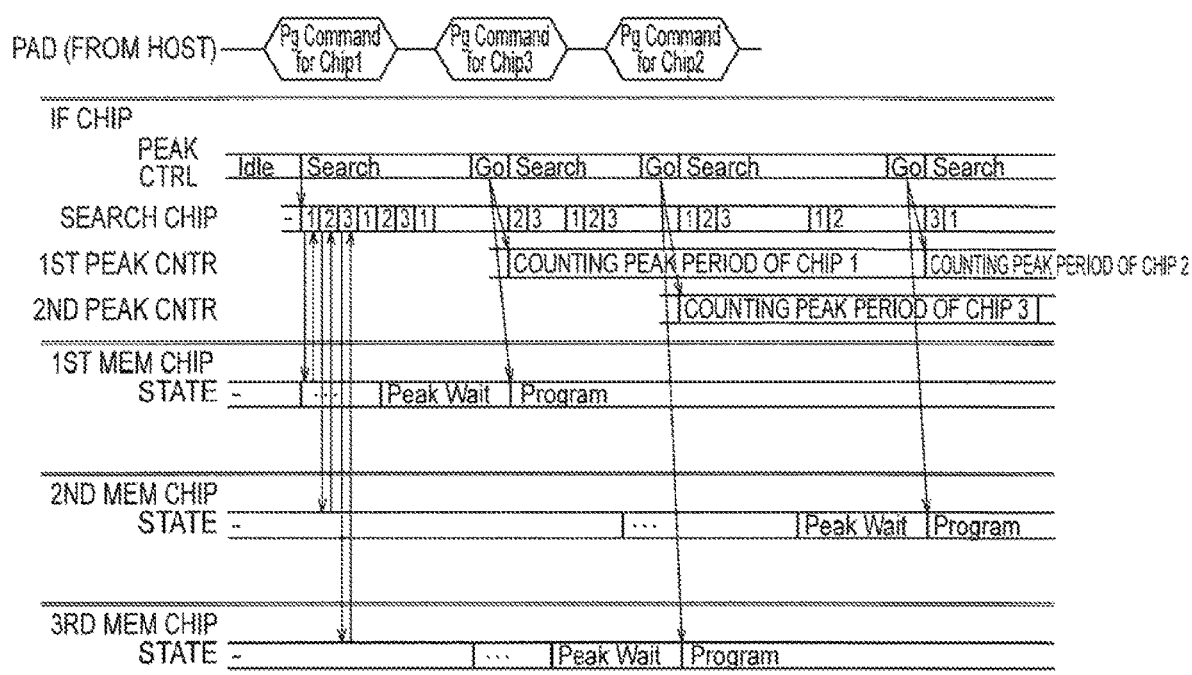
FIG. 9 is a timing chart showing operations of a semiconductor storage device of a third embodiment.
Figure 10:
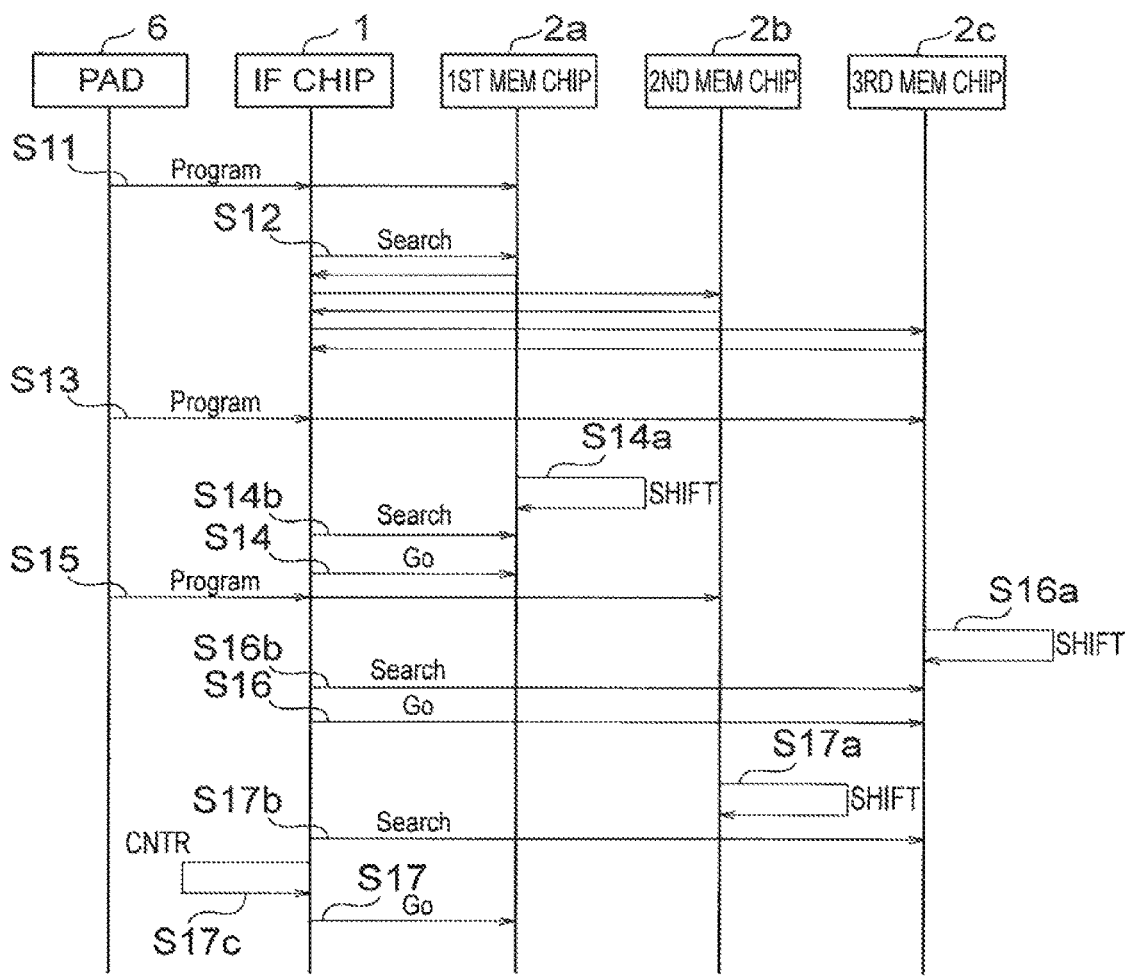
FIG. 10 is a sequence diagram showing operations of the semiconductor storage device of the third embodiment.
Figure 11A:
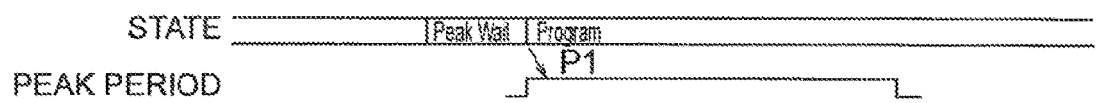
FIGS. 11A and 11B are diagrams showing a correspondence between a peak counter in an IF chip and an actual current generated by a memory chip in the third embodiment.
Figure 11B:
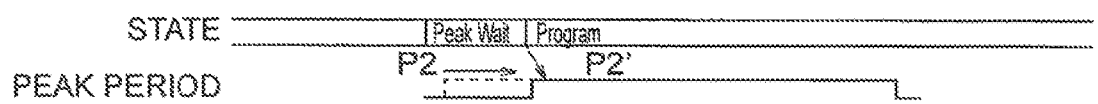

FIG. 9 is a timing chart showing operations of a semiconductor storage device of a third embodiment. FIG. 10 is a sequence diagram showing operations of the semiconductor storage device of the third embodiment, which corresponds to FIG. 9. FIGS. 11A and 11B are diagrams showing a correspondence between the peak counters 12 in the IF chip 1 and an actual current generation in the corresponding memory chip 2 in the third embodiment. FIGS. 10 and 11 will be explained in a description of FIG. 9 as appropriate.

FIG. 9 shows time-changes in commands inputted to the semiconductor storage device, the state of the peak controller 13, a memory chip 2 (a search chip) being searched for by the peak controller 13, operations of the first peak counter 12a and the second peak counter 12b, and the states of the first to third memory chips 2a to 2c.

A case where the number of the memory chips 2 is three, and at most two overlapping peak currents are permitted is described. The number of the peak counters 12 may be two or may be three or more.

A command for requesting the first memory chip 2a to execute Program is inputted (S11 in FIG. 10). The peak controller 13 is shifted to the Search state, and patrols the first to third memory chips 2a to 2c, sequentially (S12).

Next, a command for requesting the third memory chip 2c to execute Program is inputted (S13).

The first memory chip 2a is shifted to the peak wait state regarding Program (S14a). The peak controller 13 detects this peak wait state as a result of executing search (S14b). Next, the peak controller 13 detects that the number of the peak counters 12 being used is zero, and is shifted to the Go state. The peak controller 13 issues a Go instruction to the first memory chip 2a (S14), The first memory chip 2a continues the Program operation to generate a peak current. At the IF chip 1, the first peak counter 12a starts to generate a count value corresponding to a time period (peak time period) during which a peak current is generated from the first memory chip 2a.

A waveform P1 in FIG. 11A indicates this peak time period. When the peak controller 13 issues a Go instruction to the first memory chip 2a, the peak counter 12 immediately starts a counting operation for the first memory chip 2a, as shown by the waveform P1. Meanwhile, when the peak controller 13 issues a Go instruction to the first memory chip 2a, the peak wait state of the first memory chip 2a is immediately canceled but a peak current is generated from the first memory chip 2a at a timing later than this cancel timing.

Then, the peak controller 13 is returned from the Go state to the Search state.

A command for requesting the second memory chip 2b to execute Program is also inputted (S15). The third memory chip 2c is shifted to the peak wait state regarding Program (S16a). The peak controller 13 detects this peak wait state as a result of executing search (S16b). The peak controller 13 detects that the number of the peak counters 12 being used is one, and is shifted to the Go state. The peak controller 13 issues a Go instruction to the third memory chip 2c (S16). Consequently, the third memory chip 2c continues the Program operation to generate a peak current. At the IF chip 1, the second peak counter 12b starts to generate a count value corresponding to the peak time period. This situation is the same as that in FIG. 11A.

The second memory chip 2b is shifted to the peak wait state regarding Program (S17a). The peak controller 13 detects this peak wait state as a result of executing search (S17b). Then, the peak controller 13 detects that the number of the peak counters 12 being used is two. A Go instruction is not issued by any of the peak counters 12 because none of the peak counters 12 is available.

When the first peak counter 12a ends incrementing of the count value, the peak controller 13 detects that the number of the peak counters 12 being used becomes one (S17c). The peak controller 13 issues a Go instruction to the second memory chip 2b (S17). The second memory chip 2b continues the Program operation to generate a peak current. At the IF chip 1, the first peak counter 12a starts to generate a count value corresponding to this peak time period. Waveforms P2, P2' in FIG. 11B show a case where the start of the peak time period is delayed from P2 to P2' as a result of the peak control described above. The waveform P2' corresponds to the aforementioned waveform P1. Accordingly, when the peak controller 13 issues a Go instruction to the second memory chip 2b, the peak counter 12 immediately starts a counting operation for the second memory chip 2b, as indicated by the waveform P2'. Meanwhile, when the peak controller 13 issues a Go instruction to the second memory chip 2b, the peak wait state of the second memory chip 2b is immediately canceled but a peak current is generated from the second memory chip 2b at a timing later than this cancel timing.

The count value generated by the peak counter 12 may vary by a count-up method or by a count-down method. For example, in a case where the count-down method is used, when the count value reaches zero, the peak time period is determined to be ended.

In the present embodiment as described above, overlapping peak currents are suppressed by the search executed by the peak controller 13 and counting by the peak counters 12. Overlapping of peak currents can be suppressed.

Fourth Embodiment

Figure 12:
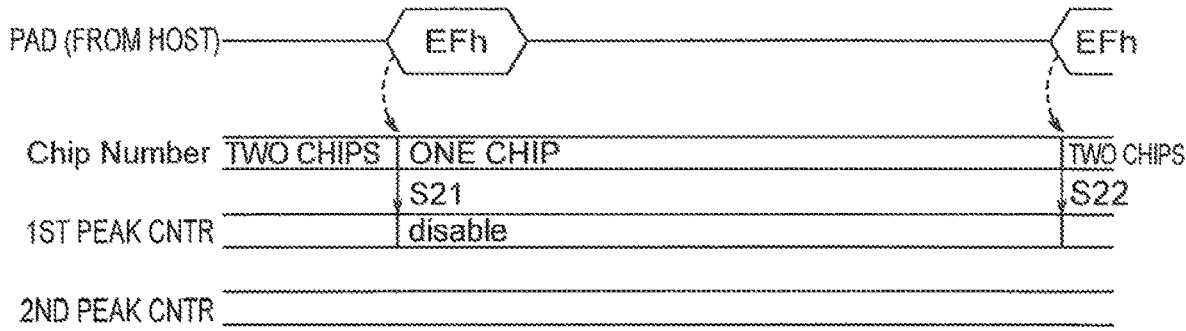
FIG. 12 is a timing chart showing an operation of a semiconductor storage device of a fourth embodiment.

FIG. 12 is a timing chart showing operations of a semiconductor storage device of a fourth embodiment. The fourth embodiment is a modification of the third embodiment.

A case where the number of the memory chips 2 is three and at most two overlapping peak currents are permitted is described. The number of the peak counters 12 may be two or may be three or more. The IF chip 1 of the present embodiment supports the setting data "Chip_Number" shown in FIG. 8. The peak controller 13 of the IF chip 1 can limit the number of the available peak counters 12 to a limit value of 2 or less, and can change this limit value according to a parameter setting command regarding the setting data "Chip_Number". This limit value limits the number of the available peak counters 12.

At step S21 in FIG. 12, a parameter setting command for changing the limit value to 1 is inputted. The peak controller 13 simulatively considers that the first peak counter 12a is executing counting. That is, since the number of the available peak counters 12 is one, at most one overlapping peak current is permitted.

At step S22 in FIG. 12, a parameter setting command for setting the limit value back to 2 is inputted. The first peak counter 12a becomes available again. That is, the number of the available peak counters 12 becomes two. Accordingly, at most two overlapping peak currents are permitted.

In the present embodiment as described above, peak currents are suppressed from overlapping with each other based on the limit value that can be changed by a user. Accordingly, a user's intension can be reflected in suppression of overlapping of peak currents.

Fifth Embodiment

Figure 13:
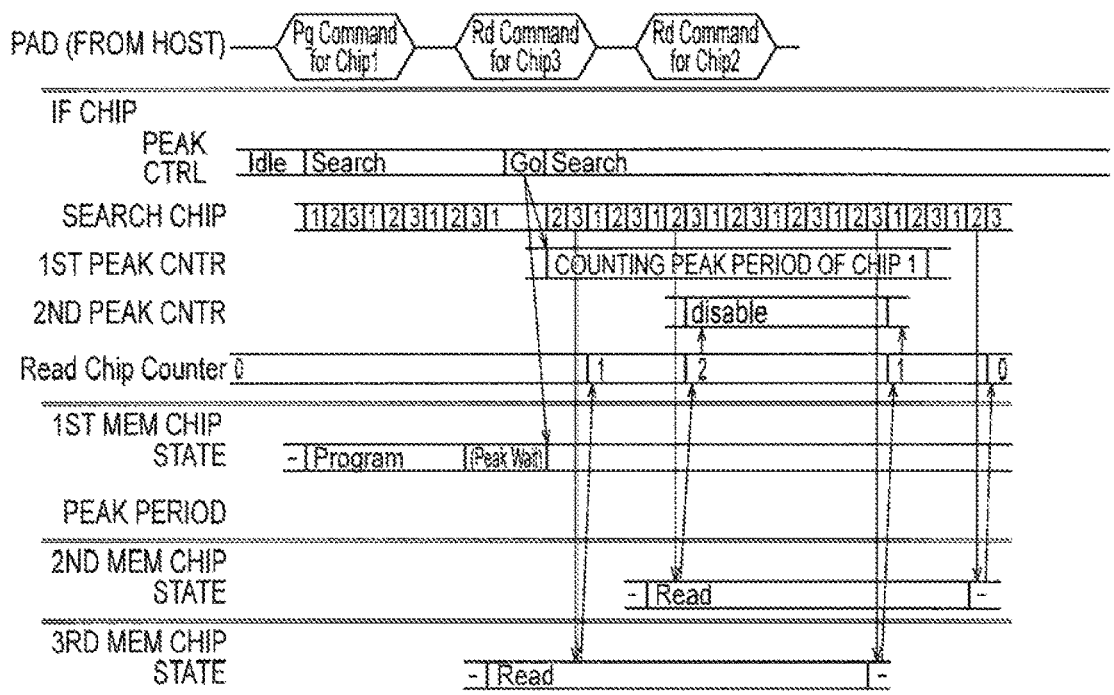
FIG. 13 is a timing chart showing operations of a semiconductor storage device of a fifth embodiment.
Figure 14:
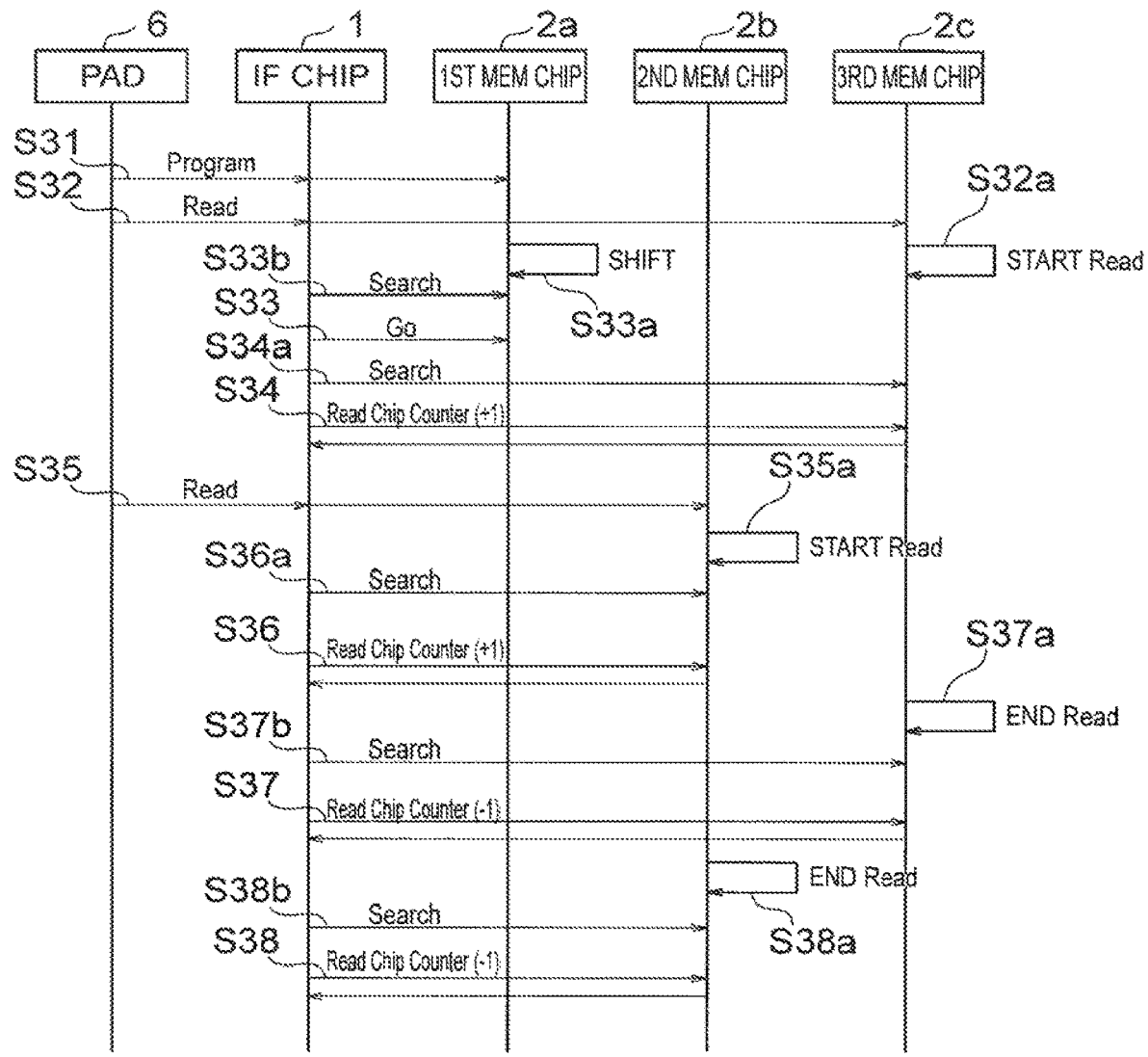
FIG. 14 is a sequence diagram showing operations of the semiconductor storage device of the fifth embodiment.

FIG. 13 is a timing chart showing operations of a semiconductor storage device of a fifth embodiment. FIG. 14 is a sequence diagram showing operations of the semiconductor storage device of the fifth embodiment, which corresponds to FIG. 13. FIG. 14 will be explained in a description of FIG. 13 as appropriate.

A case where the number of the memory chips 2 is three and at most two overlapping peak currents are permitted is described. The number of the peak counters 12 may be two or may be three or more. The IF chip 1 of the present embodiment supports the setting data "Read_Chip_Number" shown in FIG. 8. The setting data "Read_Chip_Number" is data for setting the upper limit value of the memory chips 2 operations of which overlap with one another according to a command for Read. FIG. 13 shows a count value "Read_Chip_Counter" by a chip counter in addition to the operations shown in FIG. 9. The count value "Read_Chip_Counter" is a value for managing the number of memory chips 2 that is executing Read.

A command for requesting the first memory chip 2a to execute Program is inputted (S31 in FIG. 13). The peak controller 13 is shifted to the Search state to patrol the first to third memory chips 2a to 2c, sequentially. A command for requesting the third memory chip 2c to execute Read is also inputted (S32).

The first memory chip 2a is shifted to the peak wait state regarding Program (S33a). The peak controller 13 detects this peak wait state as a result of executing search (S33b). Here, the number of the peak counters 12 being used is zero, and thus, the peak controller 13 is shifted to the Go state, and issues a Go instruction to the first memory chip 2a (S33). The first memory chip 2a continues the Program operation to generate a peak current. At the IF chip 1, the first peak counter 12a starts to generate a count value corresponding to the peak time period.

Here, the IF chip 1 of the present embodiment supports the setting data "Program_Enable" and "Read_Enable" shown in FIG. 8. In the present embodiment, a signal of the setting data "Program_Enable" is set high (is applied) and a signal of the setting data "Read_Enable" is set low (is not applied). Accordingly, as shown in FIG. 13, the state machines 22 of the memory chips 2 are each shifted to the peak wait state before generating a peak current based on Program, but not shifted to the peak wait state before generating a peak current based on Read. Consequently, the third memory chip 2c starts Read at S32a following S32.

Then, the peak con oiler 13 is shifted from the Go state to the Search state to restart patrolling. As a result of executing search, the peak controller 13 detects that the third memory chip 2c is executing Read (S34a), and changes the count value "Read_Chip_Counter" from 0 to 1 (S34).

A command for requesting the second memory chip 2b to execute Read is also inputted (S35). The second memory chip 2b starts Read at S35a following S35. As a result of executing search, the peak controller 13 detects that the second memory chip 2b is executing Read (S36a), and changes the count value "Read_Chip_Counter" from 1 to 2 (S36).

The count value "Read_Chip_Counter" reaches the value "2" which is indicated by the setting data "Read_Chip_Number". That is, the number of the memory chips 2 executing Read reaches the upper limit value. The peak controller 13 simulatively considers that the second peak counter 12b is executing counting (see "disable" in FIG. 13) by using the setting data "Chip_Number" of the fifth embodiment. That is, since the number of the available peak counters 12 is one, at most one overlapping peak current is permitted.

When Read executed by the third memory chip 2c is ended (S37a), the peak controller 13 detects that the third memory chip 2c is not executing Read as a result of executing search (S37b). The peak controller 13 changes the count value "Read_Chip_Counter" from 2 to 1 (S37). The number of the memory chips 2 executing Read becomes less than the upper limit value, and the above simulative processing is canceled. That is, since the number of the available peak counters 12 is two, at most two overlapping peak currents are permitted.

When Read executed by the second memory chip 2b is ended (S38a), the peak controller 13 detects that the second memory chip 2b is not executing Read as a result of executing search (S38b). The peak controller 13 changes the count value "Read_Chip_Counter" from 1 to 0 (S38).

In the present embodiment, a peak current based on Read is excluded from peak waiting targets because the peak current based on Read is smaller than a peak current based on Program. However, when a plurality of the memory chips 2 is simultaneously executing Read, influence of peak currents based on Read may no longer be ignored. In the present embodiment, when the number of the memory chips 2 executing Read reaches the upper limit value, the number of the available peak counters 12 is reduced, whereby the above problem is addressed.

This upper limit value can be changed by a parameter setting command for changing the value of the setting data "Read_Chip_Number". Instead of the number of the memory chips 2 executing Read, the number of the memory chips 2 executing other operations may be managed. It is desirable that an operation to be managed can be changed by a parameter setting command.

Sixth Embodiment

Figure 15:
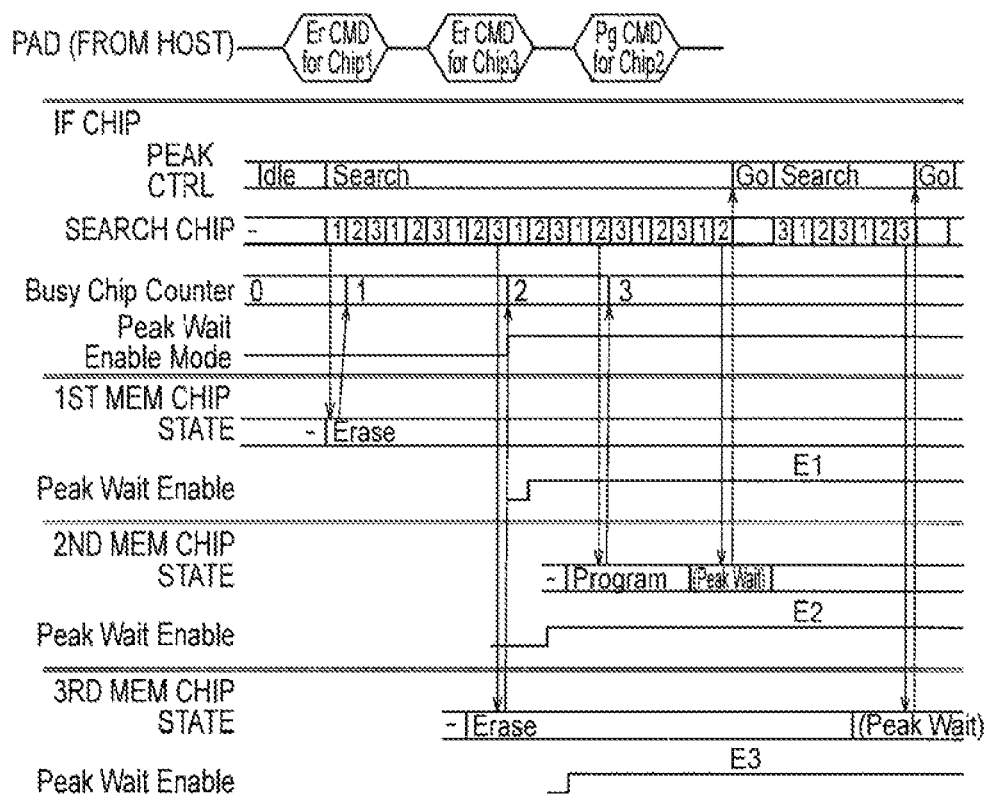
FIG. 15 is a timing chart showing operations of a semiconductor storage device of a sixth embodiment.
Figure 16:
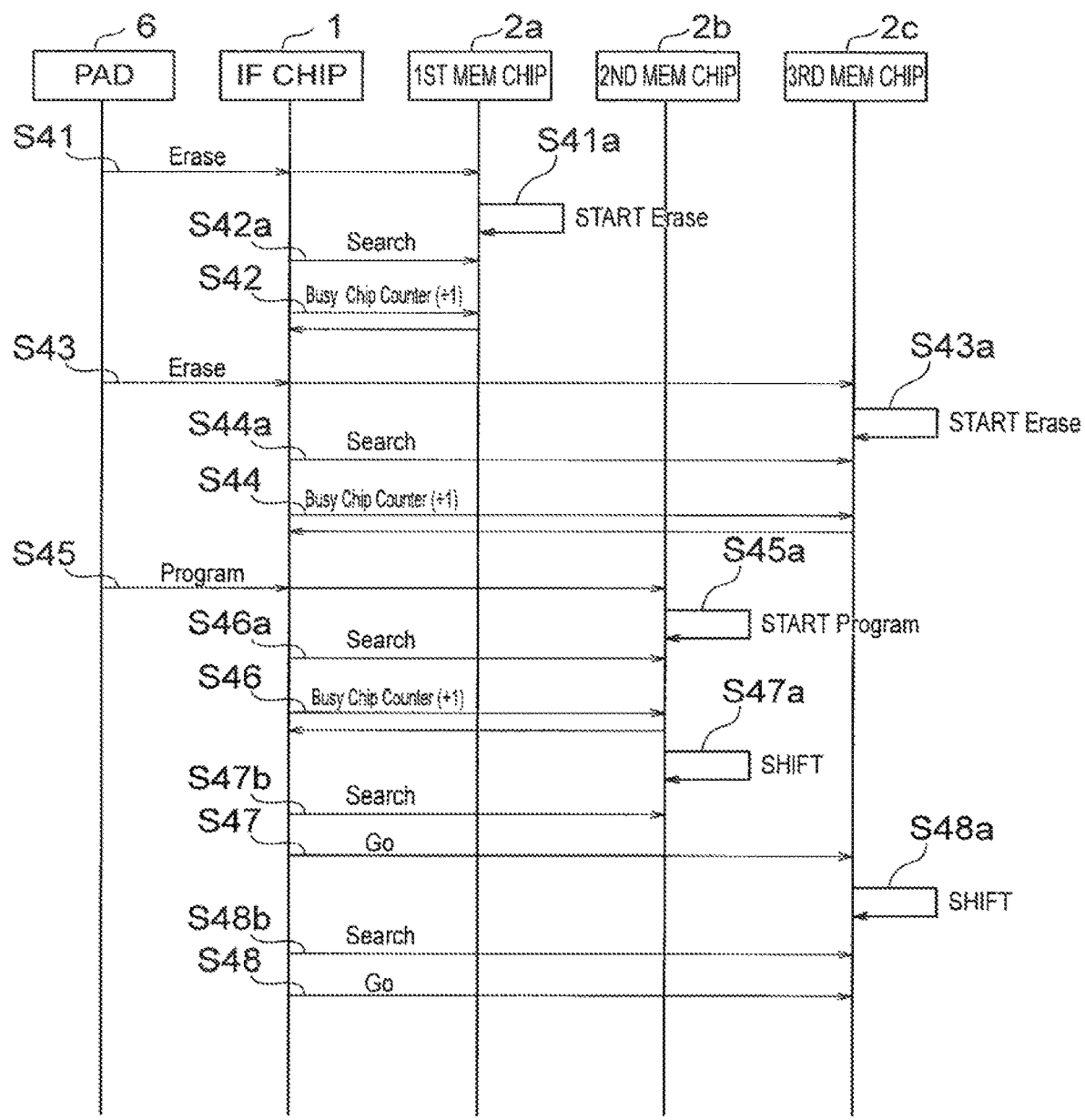
FIG. 16 is a sequence diagram showing operations of the semiconductor storage device of the sixth embodiment.

FIG. 15 is a timing chart showing operations of a semiconductor storage device of a sixth embodiment. FIG. 16 is a sequence diagram showing operations of the semiconductor storage device of the sixth embodiment, which corresponds to FIG. 15. FIG. 16 will be explained in a description of FIG. 15 as appropriate.

A case where the number of the memory chips 2 is three and at most two overlapping peak currents are permitted is described. The number of the peak counters 12 may be two or may be three or more. Further, the IF chip 1 of the present embodiment supports the setting data "Busy_Chip_Number" shown in FIG. 8. The setting data "Busy_Chip_Number" is a reference value for limiting the number of the memory chips 2 in the Busy state. Specifically, until the number of the memory chips 2 in the Busy state reaches this reference value, the state machine 22 of each of the memory chips 2 immediately generates a peak current without being shifted to the peak wait state before generating a peak current. This reference value is used as a reference for the number of the memory chips 2 in the Busy state.

FIG. 15 shows the count value "Busy_Chip_Counter" by a chip counter and signals "Peak_Wait_Enable" to the memory chips 2, in addition to the operations shown in FIG. 9.

The count value "Busy_Chip_Counter" is a value for managing the number of the memory chips 2 in the Busy state. Examples of the Busy state include a state where the memory chip 2 in question is executing Program, a state where the memory chip 2 in question is executing Read, and a state where the memory chip 2 in question is executing Erase. For example, the first memory chip 2a is executing Erase and the second memory chip 2b is executing Program. When both the memory chips 2 are simultaneously operating, the count value is 2.

The signal "Peak_Wait_Enable" is a signal for permitting transition to the peak wait state. When this signal is low, the state machine 22 of each of the memory chips 2 immediately generates a peak current without being shifted to the peak wait before generating a peak current. In contrast, when this signal is high, the state machine 22 of each of the memory chips 2 can be shifted to the peak wait state before generating a peak current. The peak controller 13 of the IF chip 1 changes this signal from low to high when the "Peak_Wait_Enable" mode becomes effective.

A command for requesting the first memory chip 2a to execute Erase is inputted (S41 in FIG. 15), and the first memory chip 2a starts Erase at S41a following S41. The peak controller 13 is shifted to the Search state to start patrolling the first to third memory chips 2a to 2c. Further, the peak controller 13 detects that the first memory chip 2a is executing Erase (S42a), and changes the count value "Busy_Chip_Counter" from 0 to 1 (S42). Here, the first memory chip 2a immediately generates a peak current without being shifted to the peak wait state before generating a peak current.

A command for requesting the third memory chip 2c to execute Erase is also inputted (S43), the third memory chip 2c starts Erase at S43a following S43. The peak controller 13 detects that the third memory chip 2c is executing Erase (S44a), and changes the count value "Busy_Chip_Counter" from 1 to 2 (S44).

The count value "Busy_Chip_Counter" reaches "2" which is indicated by the setting data "Busy_Chip_Number". That is, the number of the memory chips 2 in the Busy state reaches the reference value. The "Peak_Wait_Enable" mode of the peak controller 13 becomes effective, and the signals "Peak_Wait_Enable" to the memory chips 2 are changed from low to high (E1, E2, E3).

A command for requesting the second memory chip 2b to execute Program is also inputted (S45), and the second memory chip 2b starts Program at S45a following S45. The peak controller 13 detects that the second memory chip 2b is executing Program (S46a), and changes the count value "Busy_Chip_Counter" from 2 to 3 (S46).

The second memory chip 2b is shifted to the peak wait state regarding Program based on the signal E2 having been changed to high (S47a). The peak controller 13 detects this peak wait state as a result of executing search, and is shifted to the Go state (S47b). Then, the peak controller 13 issues a Go instruction to the second memory chip 2b (S47). The second memory chip 2b continues the Program operation and generates a peak current. Then, the peak controller 13 is shifted from the Go state to the Search state.

The third memory chip 2c is shifted to the peak wait state regarding Erase based on the signal E3 having been changed to high (S48a). The peak controller 13 detects this peak wait state as a result of executing search, and is shifted to the Go state (S48b). Then, the peak controller 13 issues a Go instruction to the third memory chip 2c (S48). The third memory chip 2c continues the Erase operation and generates a peak current.

The aforementioned reference value (threshold) can be changed by a parameter setting command for changing the setting data "Busy_Chip_Number".

Figure 17:
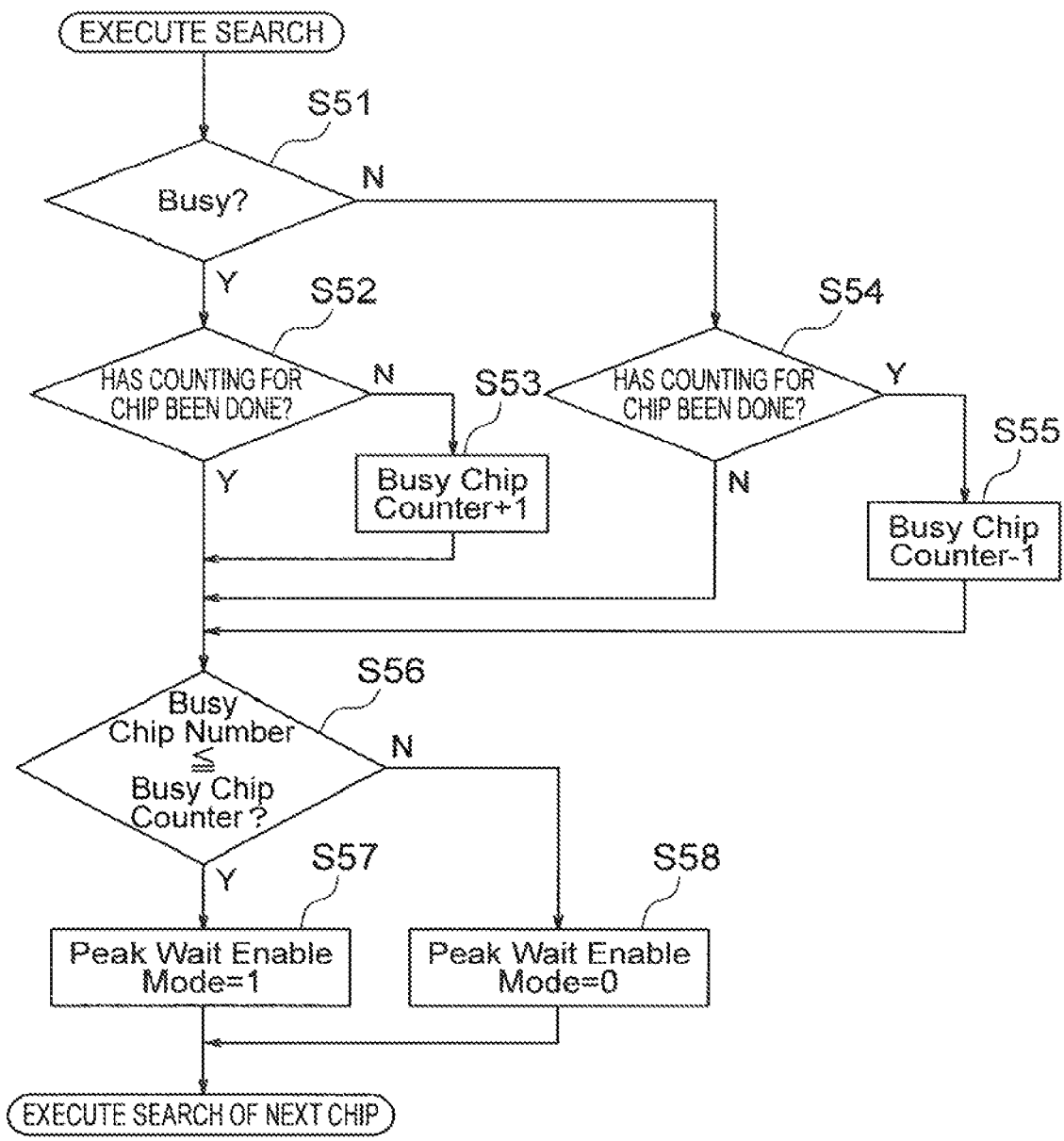
FIG. 17 is a flowchart showing operations of the semiconductor storage device of the sixth embodiment.

FIG. 17 is a flowchart shoving operations of the semiconductor storage device of the sixth embodiment. FIG. 17 shows the details of processes for detecting the Busy state in FIG. 15.

When detecting that one of the memory chips 2 is in the Busy state, the peak controller 13 determines whether or not counting for the memory chip 2 in question has been done with use of the count value "Busy_Chip_Counter" (S51, S52). When counting has been done, the count value is kept, and the peak controller 13 advances to S56. When counting has not been done, the count value is incremented by 1, and the peak controller 13 advances to S56 (S53).

When detecting that one of the memory chips 2 is not in the Busy state, the peak controller 13 determines whether or not counting for the memory chip 2 in question has been done with use of the count value "Busy_Chip_Counter" (S51, S54). When counting has been done, the count value is decremented by 1 and the peak controller 13 advances to S56 (S55). When counting has not been done, the count value is kept and the peak controller 13 advances to S56.

At 556, the peak controller 13 determines whether or not the count value "Busy_Chip_Counter" is equal to or greater than the value of the setting data "Busy_Chip_Number" (S57). When the determination result is YES, the "Peak_Wait_Enable" mode of the peak controller 13 becomes effective (1) (S58). When the determination result is NO, the "Peak_Wait_Enable" mode of the peak controller 13 becomes ineffective (0) (S59).

The peak controller 13 repeatedly executes the processes S51 to S58 on all of the memory chips 2.

The first embodiment is compared with the sixth embodiment. The memory chips 2 in the first embodiment are each shifted to the peak wait state before generating a peak current. In this case, a time period until each of the memory chips 2 receives a Go instruction becomes overhead. In contrast, according to the sixth embodiment, such overhead can be suppressed as a result of limiting transition to the peak wait state, whereby the operation time can be shortened.

Seventh Embodiment

Figure 18:
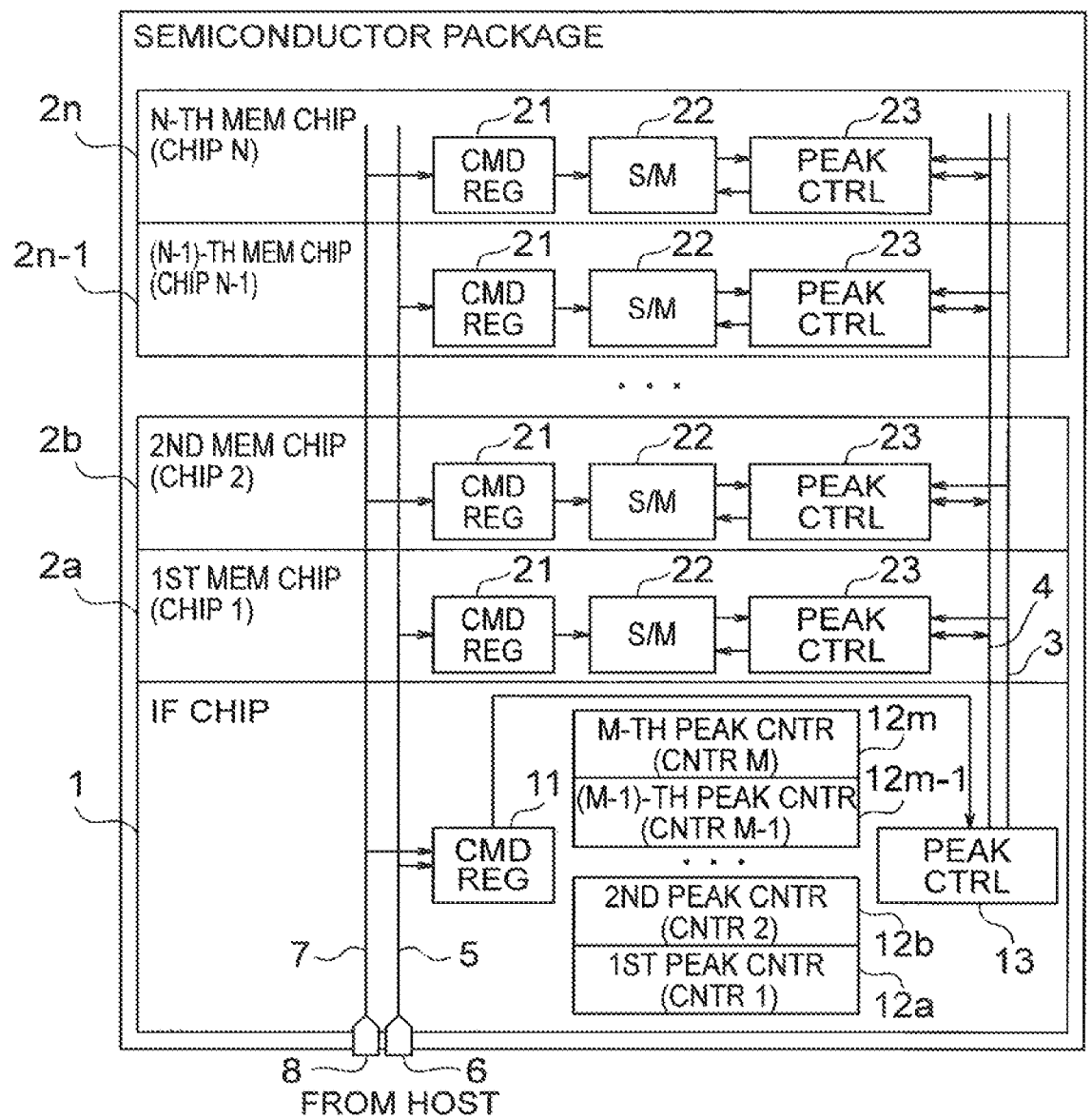
FIG. 18 is a block diagram illustrating a configuration of a semiconductor storage device of a seventh embodiment.

FIG. 18 is a block diagram illustrating a configuration of a semiconductor storage device of a seventh embodiment.

In the present embodiment, the semiconductor storage device in FIG. 1 is replaced with the semiconductor storage device in FIG. 18. The semiconductor storage device in FIG. 18 includes an external access channel 7 and a pad 8 in addition to the components illustrated in FIG. 1. The external access channels 5, 7 are examples of first and second channels, respectively.

The configuration of the external access channel 7 is the same as that of the external access channel 5. Through the external access channel 7, a command from the external host is inputted to the semiconductor storage device via the pad 8. The external access channel 7 is formed of the TSV electrode 36, etc. in FIG. 2.

As described above, the semiconductor storage device of the present embodiment includes a plurality of the external access channels 5, 7. The memory chips 2a, 2c, . . . 2n−1 each operate in accordance with a first command from the external access channel 5 so as to generate a first peak current. On the other hand, the memory chips 2b, 2d, . . . 2n each operate in accordance with a second command from the external access channel 7 so as to generate a second peak current. Accordingly, peak control according to the present embodiment is performed for each of the external access channels 5, 7. Hereinafter, the external access channels 5, 7 are referred to as "first and second channels 5, 7", as appropriate.

The above explanation assumes that the number of the memory chips is an even number. However, the same explanation applies to a case where the number of the memory chips is an odd number. As a rule for which memory chip 2 is connected to the first channel 5 and for which memory chip 2 is connected to the second channel 7, any other rule other than the aforementioned one can be used.

Figure 19:
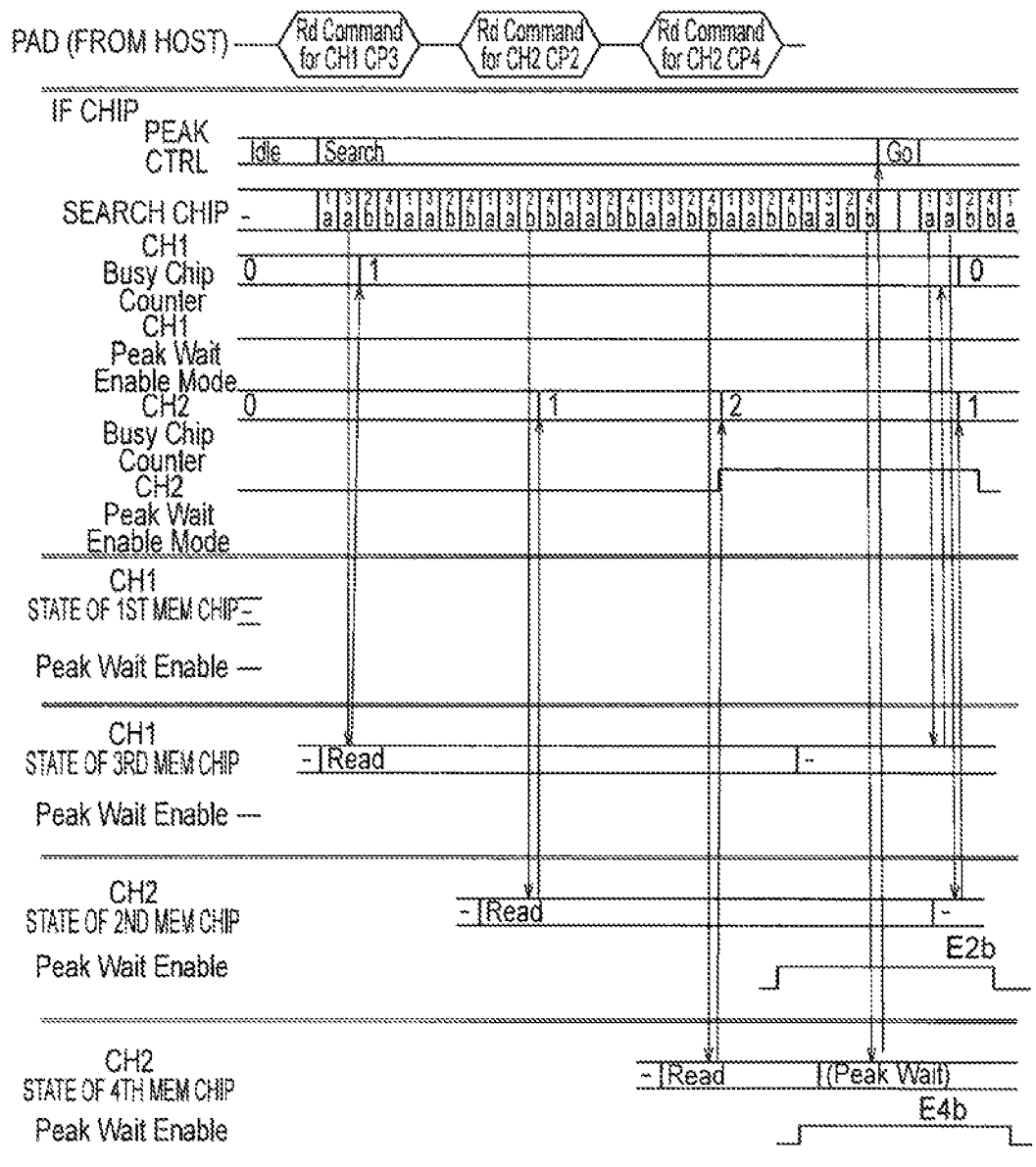
FIG. 19 is a timing chart showing operations of the semiconductor storage device of the seventh embodiment.
Figure 20:
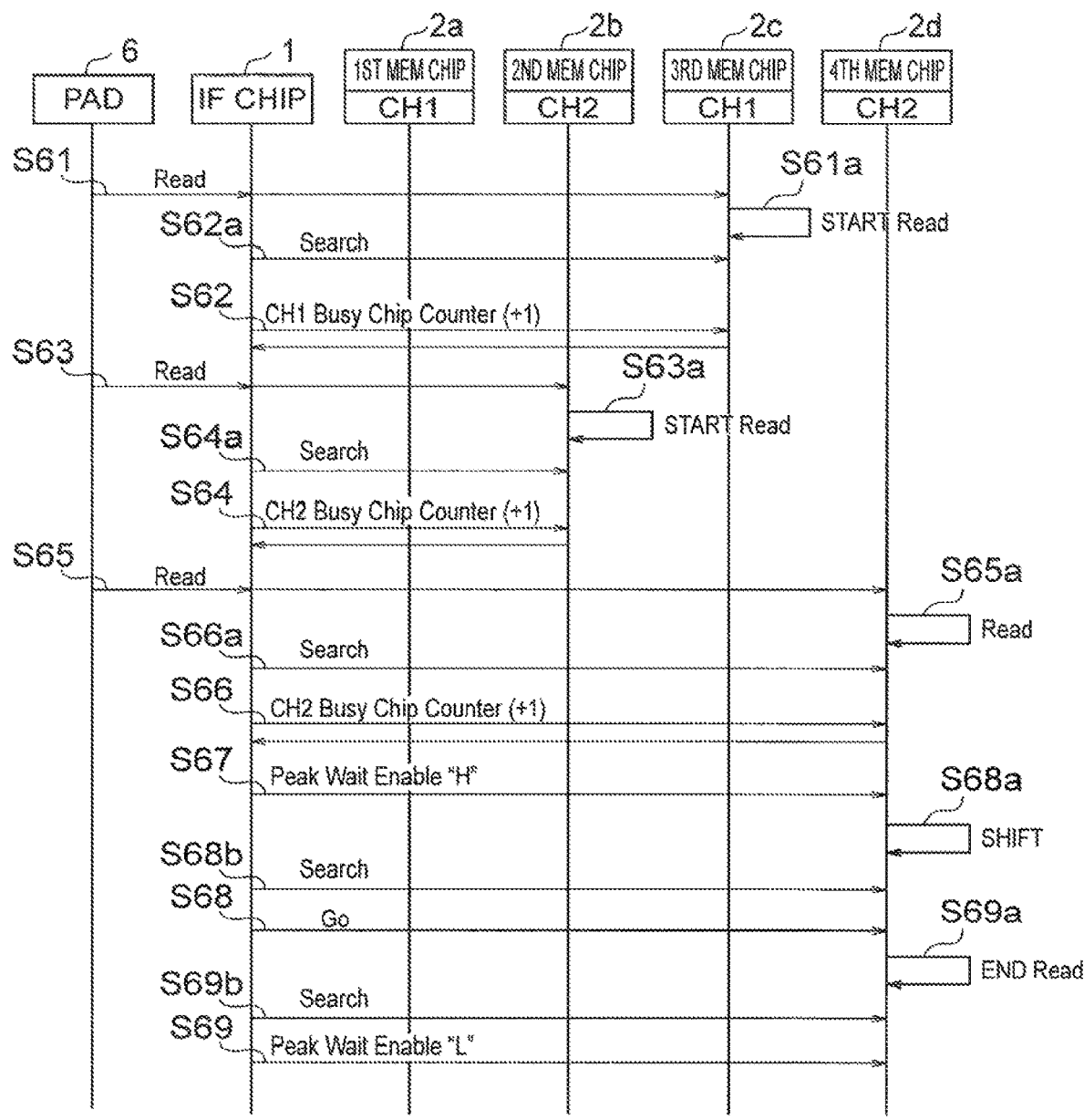
FIG. 20 is a sequence diagram showing operations of the semiconductor storage device of the seventh embodiment.

FIG. 19 is a timing chart showing operations of the semiconductor storage device of the seventh embodiment. FIG. 20 is a sequence diagram showing operations of the semiconductor storage device of the seventh embodiment, and corresponds to FIG. 19. FIG. 20 will be explained in a description of FIG. 19 as appropriate.

Names of the count values and signals recited in FIG. 19 are each denoted by a reference character CH1, which represents the first channel 5, or a reference character CH2, which represents the second channel 7. For example, the state of the first memory chip 2a denoted by CH1 indicates the state of the state machine 22 when the first memory chip 2a operates in accordance with the first command. The count value "Busy_Chip_Counter" denoted by CH2 indicates the number of the memory chips 2 in the Busy state generated in accordance with the second command. The numeral "4b" in the search chip row indicates that the state of the fourth memory chip 2d generated in accordance with the second command is searched for.

The number N of the memory chips 2 in the present embodiment may be any number. However, only four memory chips 2 are illustrated for convenience in the diagram in FIG. 19.

A first command for requesting the third memory chip 2c to execute Read is inputted through the first channel 5 (S61 in FIG. 20), and the third memory chip 2c starts Read at S61a following S61. The peak controller 13 is shifted to the Search state to start patrolling the first to fourth memory chips 2a to 2d. Further, the peak controller 13 detects that the third memory chip 2c is executing Read in accordance with the first command (S62a), and changes the CH1 count value "Busy_Chip_Counter" from 0 to 1 (S62). Here, the third memory chip 2c immediately generates a peak current without being shifted to the peak wait state before generating a peak current.

A second command for requesting the second memory chip 2b to execute Read is inputted through the second channel 7 (S63), and the second memory chip 2b starts Read at S63a following S63. Further, the peak controller 13 detects that the second memory chip 2b is executing Read in accordance with the second command (S64a), and changes the CH2 count value "Busy_Chip_Counter from" 0 to 1 (S64). Here, the second memory chip 2b immediately generates a peak current without being shifted to the peak wait state before generating a peak current.

A second command for requesting the fourth memory chip 2d to execute Read is inputted through the second channel 7 (S65), and the fourth memory chip 2d starts Read at S65a following S65. Further, the peak controller 13 detects that the fourth memory chip 2d is executing Read in accordance with the second command (S66a), and changes the CH2 count value "Busy_Chip_Counter" from 1 to 2 (S66).

The CH2 count value "Busy_Chip_Counter" reaches the value "2" which is indicated by the CH2 setting data "Busy_Chip_Number". That is, the number of the memory chips 2 in the CH2 Busy state reaches the reference value. The CH2 "Peak_Wait_Enable" mode of the peak controller 13 becomes effective, the signals "Peak_Wait_Enable" to the memory chips 2 for CH2 are changed from low to high (S67, E2b, E4b).

The fourth memory chip 2d is shifted to the peak wait state regarding CH2 Read based on the signal E4b having been changed to high (S68a). The peak controller 13 detects this peak wait state as a result of executing search, and is shifted to the Go state (S68b). Then, the peak controller 13 issues a Go instruction regarding the CH2 Read to the fourth memory chip 2d (S68). The fourth memory chip 2d continues the Read operation and generates a peak current. Then, the peak controller 13 is shifted from the Go state to the Search state.

When Read executed by the fourth memory chip 2d is ended (S69a), the peak controller 13 detects that the fourth memory chip 2d is not executing Read as a result of executing search (S69b). Accordingly, the CH2 count value "Busy_Chip_Counter" is changed from 2 to 1 (S69). The CH2 "Peak_Wait_Enable" mode of the peak controller 13 becomes ineffective, and the signals "Peak_Wait_Enable" to the memory chips 2 for CH2 is changed from high to low (S69, E2b, E4b).

As described above, the peak control according to the present embodiment is performed separately for the first channel 5 and the second channel 7. Therefore, according to the present embodiment, appropriate peak control in which the different channels are discriminated can be performed, whereby the operation time can be shortened while excess peak currents are suppressed.

Eighth Embodiment

Figure 21:
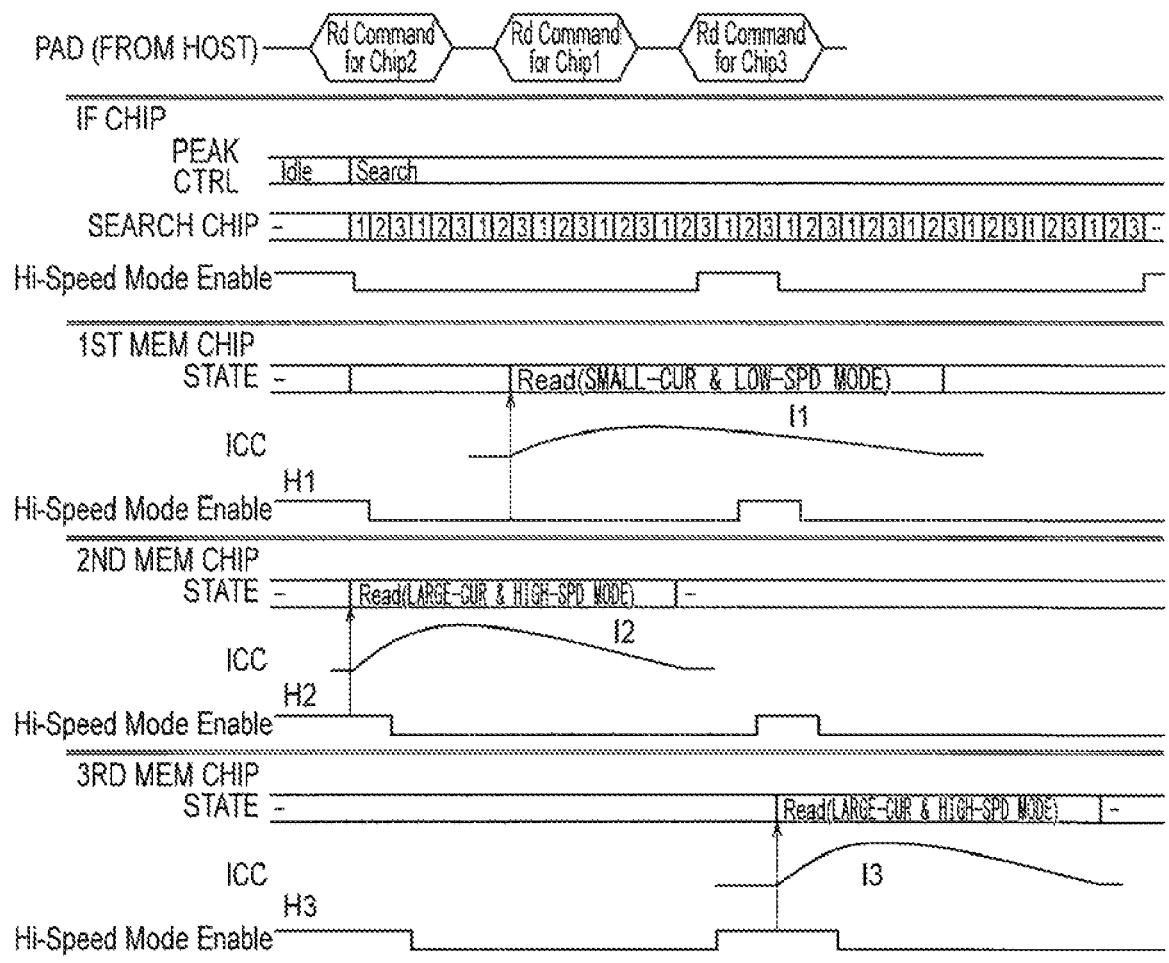
FIG. 21 is a timing chart showing operations of a semiconductor storage device of an eighth embodiment.
Figure 22:
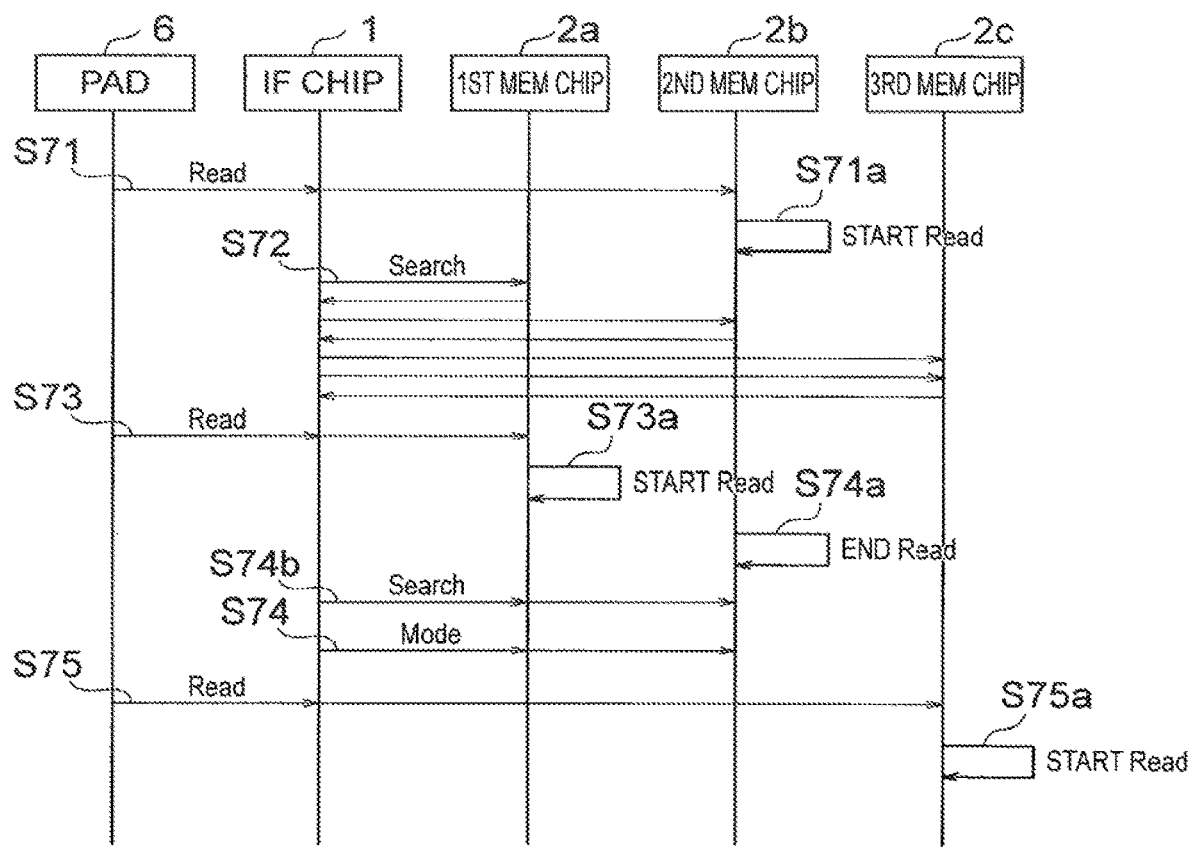
FIG. 22 is a sequence diagram showing operations of the semiconductor storage device of the eighth embodiment.

FIG. 21 is a timing chart showing operations of a semiconductor storage device of an eighth embodiment. FIG. 22 is a sequence diagram showing operations of the semiconductor storage device of the eighth embodiment, which corresponds to FIG. 21. FIG. 22 will be explained in a description of FIG. 21 as appropriate.

FIG. 21 shows the waveforms of consumed currents (ICC) generated from the memory chips 2 and signals "High_Speed_Mode_Enable" in the IF chip 1 and in the memory chips 2 In addition to the operations having been described so far.

When the signal "High_Speed_Mode_Enable" is high, the peak controller 13 of the IF chip 1 is in a first mode (a large-current and high-speed mode) in which a continuance time period (operating time period) of current consumption is controlled to a first time period. In the first mode, the consumed current amount is large and the continuance time period of current consumption is short.

When the signal "High_Speed_Mode_Enable" is low, the peak controller 13 of the IF chip 1 is in a second mode (a small-current and low-speed mode) in which the continuance time period of current consumption is controlled to a second time period which is longer than the first time period. In the second mode, the consumed current amount is small and the continuance time period of current consumption is long.

The semiconductor storage device of the present embodiment operates as follows, for example.

A command for requesting the second memory chip 2b to execute Read is inputted (S71 in FIG. 22). The second memory chip 2b starts Read in accordance with this command (S71a), and current consumption occurs (I2). The second memory chip 2b is in the first mode (H2) when receiving this command. Accordingly, the consumed current amount is large and the continuance time period of the current consumption is short.

After S71, the peak controller 13 is shifted to the Search state to start patrolling the first to third memory chips 2a to 2c (S72). After the peak controller 13 is shifted from the Idle state to the Search state, the peak controller 13 changes the mode of the peak controller 13 to the second mode and also changes the mode of each of the memory chips 2 to the second mode (H1, H2, H3), Then, when the peak controller 13 detects that at least one of the memory chips 2 in the semiconductor storage device is operating in the first mode, the peak controller 13 changes the mode of the peak controller 13 to the second mode, and also changes the mode of each of the memory chips 2 to the second mode.

A command for requesting the first memory chip 2a to execute Read is also inputted (S73). The first memory chip 2a starts Read in accordance with this command (S73a), and current consumption occurs (I1). The first memory chip 2a is in the second mode (H1) when receiving this command. Accordingly, the consumed current amount is small and the continuance time period of the current consumption is long.

When Read executed by the second memory chip 2b is ended (S74a), the peak controller 13 detects this (S74b) and recognizes that none of the memory chips 2 in the semiconductor storage device is operating in the first mode. Accordingly, the peak controller 13 changes the mode of the peak controller 13 to the first mode, and also changes the mode of each of the memory chips 2 to the first mode (S74, H1, H2, H3).

A command for requesting the third memory chip 2c to execute Read is also inputted (S75). The third memory chip 2c starts Read in accordance with this command (S75a), and a consumed current occurs (I3). The third memory chip 2c is in the first mode (H3) when receiving this command. Accordingly, the consumed current amount is large and the continuance time period of the current consumption is short. Then, the peak controller 13 detects that the third memory chip 2c is operating in the first mode, and changes the mode of the peak controller 13 to the second mode, and also changes the mode of each of the memory chips 2 to the second mode.

According to the present embodiment, as a result of such mode control, reduction of consumed currents and shortening of the operation time can be balanced. For example, when commands for requesting Read are continuously inputted, the first Read is executed with large current consumption at high speed and the second Read is executed with small current consumption at low speed. The second Read, which is executed while data output after the first Read is being executed, only needs to be ended before the data output is completed. Therefore, the low speed of the second Read can be covered.

Therefore, according to the present embodiment, operations can be executed at high speed while the total current in the semiconductor package is adjusted so as not to exceed an allowable value.

Ninth Embodiment

Figure 23:
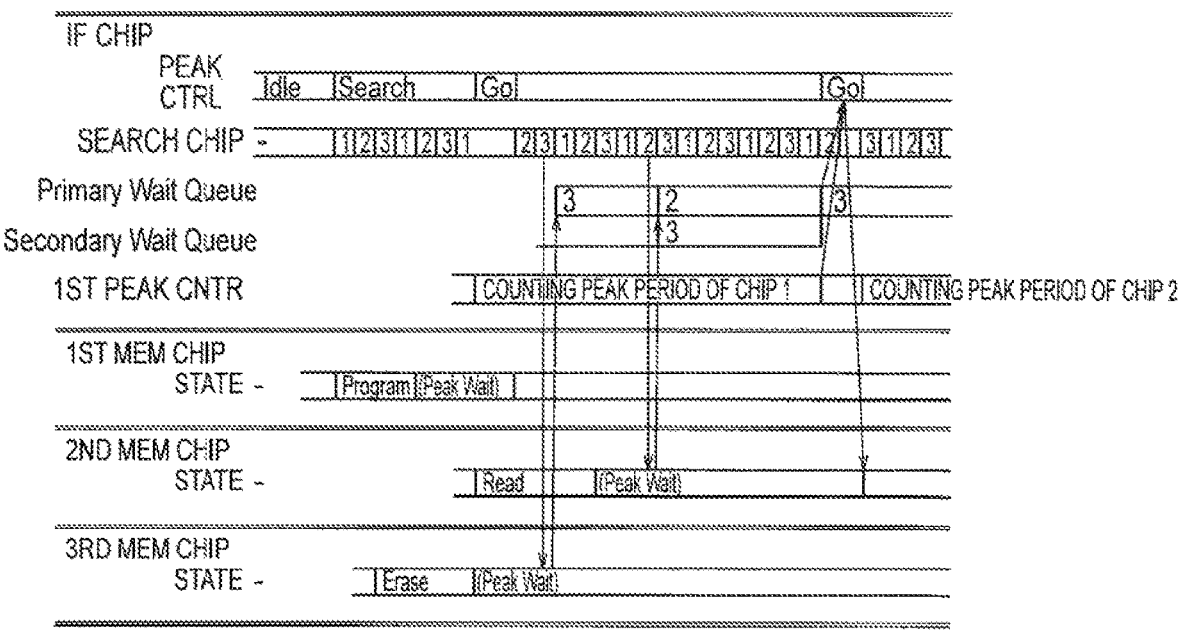
FIG. 23 is a timing chart showing operations of a semiconductor storage device of a ninth embodiment.
Figure 24:
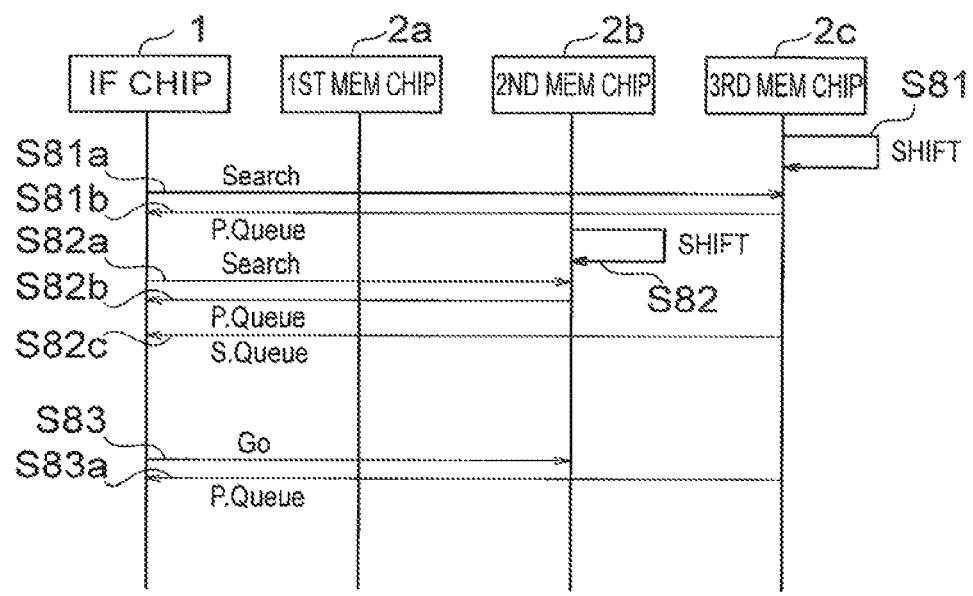
FIG. 24 is a sequence diagram showing operations of the semiconductor storage device of the ninth embodiment.

FIG. 23 is a timing chart showing operations of a semiconductor storage device of a ninth embodiment. FIG. 24 is a sequence diagram showing operations of the semiconductor storage device of the ninth embodiment, which corresponds to FIG. 23. FIG. 24 will be explained in a description of FIG. 23 as appropriate.

FIG. 23 shows the value of a parameter "Primary_Wait_Queue" and the value of a parameter "Secondary_Wait_Queue" in the IF chip 1, in addition to the operations having described so far. The former parameter stores the identification information about the memory chip 2 to which the highest priority is given. The latter parameter stores the identification information about the memory chip 2 to which the second highest priority is given. In addition, the IF chip 1 of the present embodiment supports the setting data "Chip_Number" shown in FIG. 8, and this setting data is set to a value of "1".

The peak controller 13 of the present embodiment manages information about priorities for Program, Read, and Erase. Specifically, the highest priority is given to Read, and the second highest priority is given to Program, and the third highest priority is given to Erase. The values of the parameters "Primary_Wait_Queue", "Secondary_Wait_Queue" in FIG. 23 are set based on these priority levels.

The semiconductor storage device of the present embodiment operates as follows, for example.

The third memory chip 2c is shifted to the peak wait state regarding Erase (S81 in FIG. 24). The peak controller 13 detects this peak wait state as a result of executing search (S81a). Here, it is assumed that all of the peak counters 12 are being used, and thus, no counter is available. Accordingly, the peak controller 13 sets the value "3", which represents the third memory chip 2c, as the parameter "Primary_Wait_Queue" (S81b). When any one of the counters becomes available, a Go instruction is issued preferentially to the third memory chip 2c even in a case where a plurality of the peak wait states exist.

The second memory chip 2b is shifted to the peak waft state regarding Read (S82). The peak controller 13 detects this peak wait state as a result of executing search (S82a). Here, it is assumed that all of the peak counters 12 are being used, and thus, no counter is available. Accordingly, the peak controller 13 sets the value "2", which represents the second memory chip 2b, as a value which can be set as the parameter "Primary_Wait_Queue" or "Secondary_Wait_Queue".

Here, the priority level for Read is set to be higher than the priority level for Erase. Accordingly, the peak controller 13 sets the value "2" representing the second memory chip 2b, as the parameter "Primary_Wait_Queue" (S82b). Accordingly, the peak controller 13 moves the numerical value "3", which represents the third memory chip 2c, to the parameter "Secondary_Wait_Queue" (S82c). When any one of the counters becomes available, the peak controller 13 preferentially issues a Go instruction regarding Read to be executed by the second memory chip 2b, and then, issues a Go instruction regarding Erase to be executed by the third memory chip 2c.

Consequently, when any one of the counters becomes available after S83c, the peak controller 13 issues a Go instruction regarding Read to the second memory chip 2b (S83). The peak controller 13 moves the numerical value "3", which represents the third memory chip 2c, to the parameter "Primary_Wait_Queue" (S83a).

In the present embodiment, a principle of preferentially executing an operation which needs to be executed within a shorter time since the input of a command is adopted. Specifically, the priority level for Read is set to be the highest because Read is desired to be executed within a short time. Consequently, a delay in starting an operation to be executed within in a short time can be suppressed.

Tenth Embodiment

Figure 25:
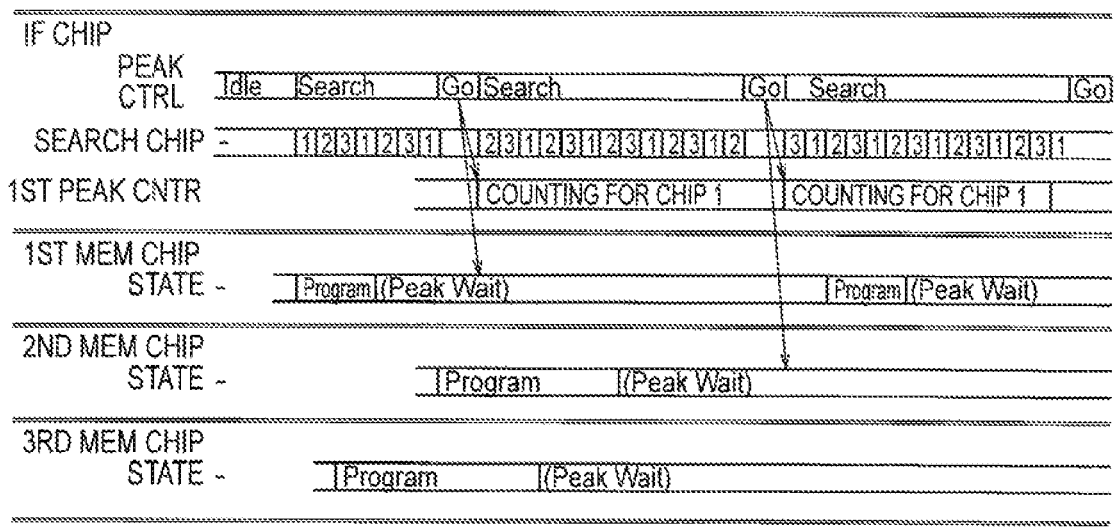
FIG. 25 is a timing chart showing operations of a semiconductor storage device of a tenth embodiment.
Figure 26:
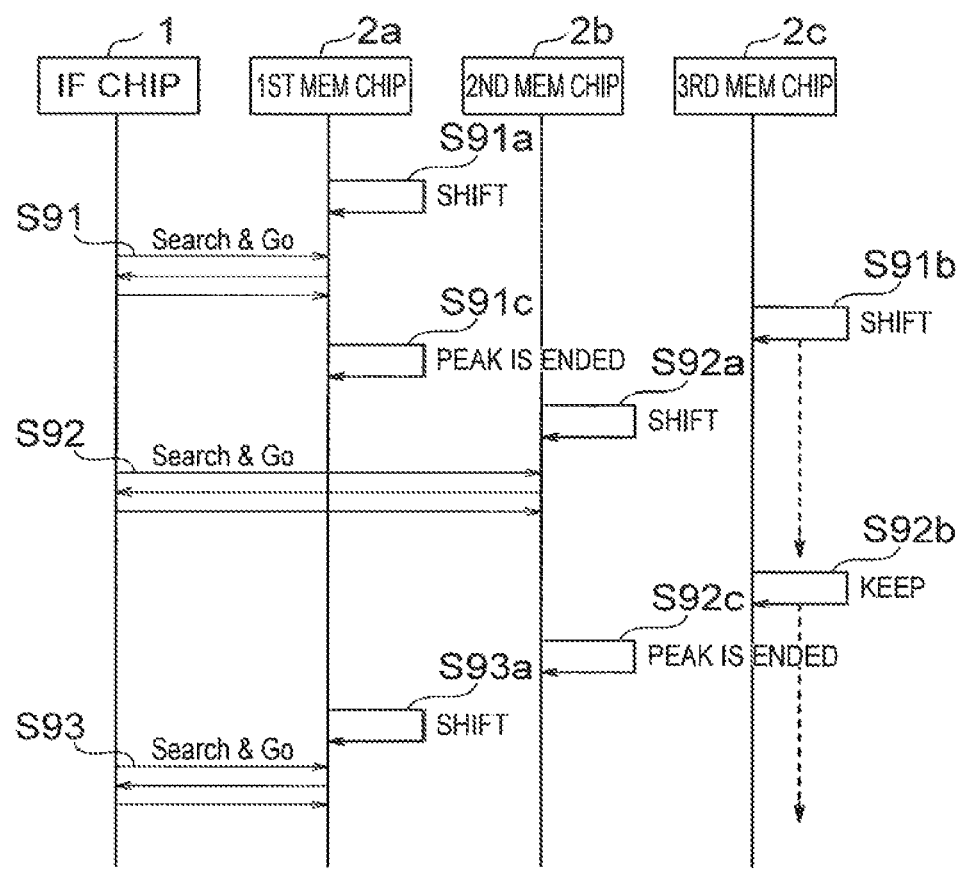
FIG. 26 is a sequence diagram showing operations of the semiconductor storage device of the tenth embodiment.
Figure 27:
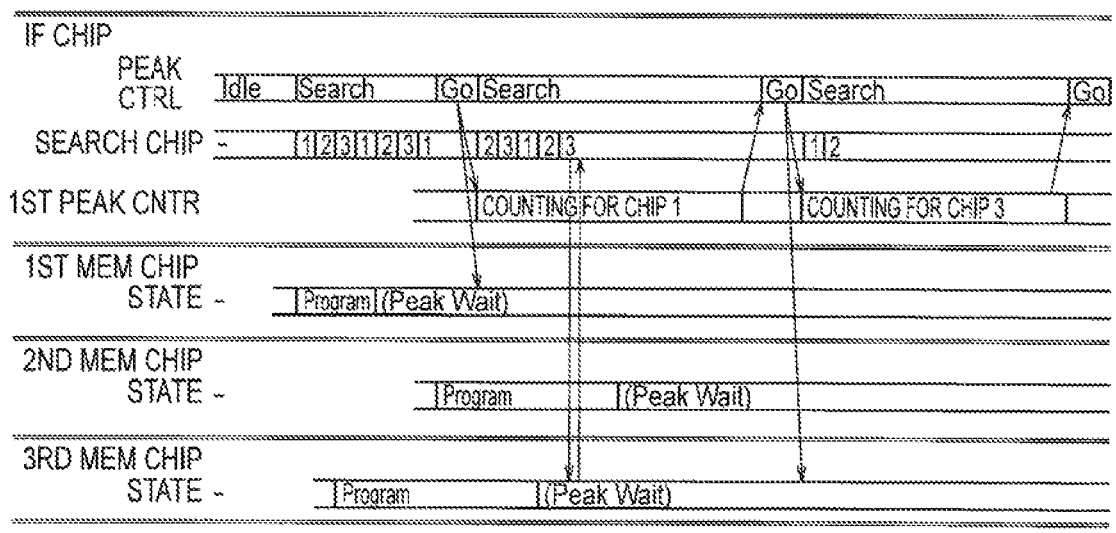
FIG. 27 is a timing chart showing operations of the semiconductor storage device of the tenth embodiment.
Figure 28:
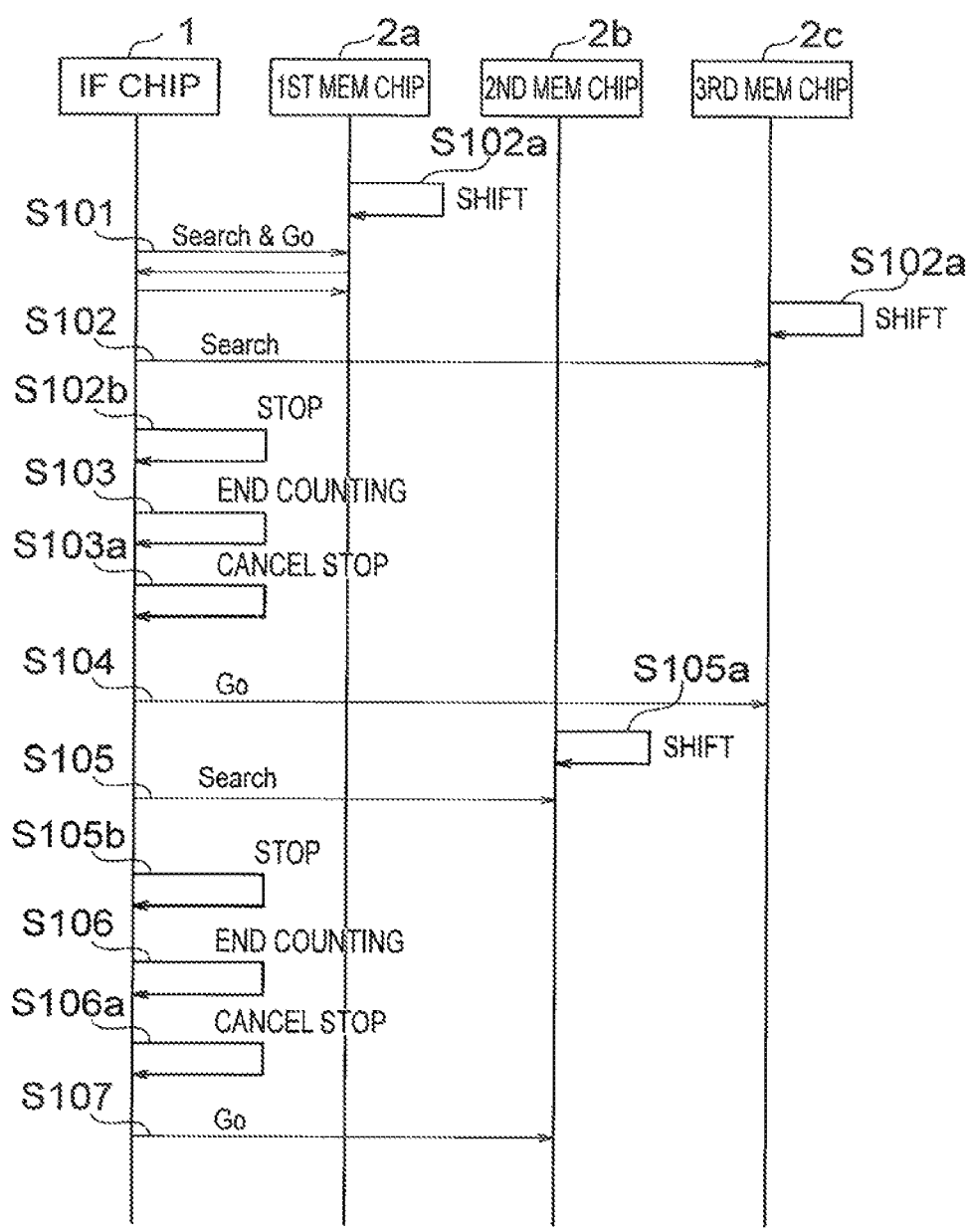
FIG. 28 is a sequence diagram showing operations of the semiconductor storage device of the tenth embodiment.

FIGS. 25 and 27 are timing charts showing operations of a semiconductor storage device of a tenth embodiment. FIGS. 26 and 28 are sequence diagrams showing operations of the semiconductor storage device of the tenth embodiment. FIGS. 26 and 28 correspond to FIGS. 25 and 27, respectively. FIGS. 26 and 28 will be explained in descriptions of FIGS. 25 and 27 as appropriate, respectively.

In examples shown in FIGS. 25 and 27, a case where none of the peak counters 12 is available is addressed by different methods. In FIG. 25, when such a case occurs, a Go instruction is issued to the memory chip 2 the peak wait state of which is first detected through the search executed when any one of the peak counters 12 becomes available again. In FIG. 27, when such a case occurs, a Go instruction is issued to the memory chip 2 the peak wait state of which is first detected through the search executed after all of the peak counters 12 become unavailable.

A first example where all of the peak counters 12 are unavailable, is a case where all of the peak counters 12 in the IF chip 1 are being used as described in the third embodiment. A second example where all of the peak counters 12 is unavailable is a case where the number of the peak counters 12 being used reaches the limit value as described in the fourth embodiment. Each of the methods in FIGS. 25 and 27 can be applied to both the first and second examples. The IF chip 1 of the present embodiment supports the setting data "Chip_Number" shown in FIG. 8, and this setting data is set to a value of "1".

First, the method used in FIG. 25 is described.

The first memory chip 2a is shifted to the peak wait state regarding Program (S91a in FIG. 26). The peak controller 13 detects this peak wait state as a result of executing search (S91). Accordingly, a Go instruction is issued to the first memory chip 2a, and the first memory chip 2a generates a peak current. Consequently, all the peak counter 12 are unavailable.

The peak controller 13 continues patrolling. In the peak time period of the first memory chip 2a, the third memory chip 2c is shifted to the peak wait state regarding Program (S91b), the peak controller 13 does not issue a Go instruction to the third memory chip 2c.

When the peak time period of the first memory chip 2a is ended (S91c), one of the peak counters 12 becomes available again. Here, the peak controller 13 first detects the peak wait state of the second memory chip 2b (S92a, S92) after the peak time period of the first memory chip 2a is ended. Accordingly, a Go instruction is issued to the second memory chip 2b and a peak current is generated. Consequently, all the peak counters 12 are unavailable, again.

The peak controller 13 continues patrolling. During the peak time period of the second memory chip 2b, the third memory chip 2c is kept in the peak wait state (S92b). However, the peak controller 13 does not issue a Go instruction to the third memory chip 2c.

When the peak time period of the second memory chip 2b is ended (S92c), one of the peak counters 12 becomes available again. Here, the peak controller 13 first detects the peak wait state of the first memory chip 2a (S93a, S93) after the peak time period of the second memory chip 2b is ended. Accordingly, a Go instruction is issued to the first memory chip 2a so that a peak current is generated. As a result, all the peak counters 12 are unavailable again.

Next, the method in FIG. 27 is described.

The first memory chip 2a is shifted to the peak wait state regarding Program (S101a in FIG. 28). The peak controller 13 detects this peak wait state as a result of executing search (S101). Accordingly, a Go instruction is issued to the first memory chip 2a, and the first memory chip 2a generates a peak current. Consequently, all the peak counters 12 are unavailable.

The peak controller 13 continues patrolling. In the peak time period of the first memory chip 2a, the third memory chip 2c is shifted to the peak wait state regarding Program (S102a), but the peak controller 13 does not issue a Go instruction to the third memory chip 2c (S102). However, the peak controller 13 stops the patrolling at a time point when the peak controller 13 detects the peak wait state of the third memory chip 2c (S102b), and waits for any one of the peak counters 12 to become available.

When the peak time period of the first memory chip 2a is ended, one of the peak counter 12 becomes available again (S103). Accordingly, the peak controller 13 cancels the above stop (S103a), and issues a Go instruction to the third memory chip 2c (S104). The third memory chip 2c generates a peak current, and all the peak counters 12 are unavailable again.

The peak controller 13 continues patrolling. In the peak time period of the third memory chip 2c, the second memory chip 2b is shifted to the peak wait state regarding Program (S105a) but the peak controller 13 does not issue a Go instruction to the second memory chip 2b (S105). However, the peak controller 13 stops the patrolling at a time point when the peak controller 13 detects the peak wait state of the second memory chip 2b (S105b), and waits for any one of the peak counters 12 to become available.

When the peak time period of the third memory chip 2c is ended, one of the peak counters 12 becomes available again (S106). Accordingly, the peak controller 13 cancels the above stop (S106a), and issues a Go instruction to the second memory chip 2b (S107). The second memory chip 2b generates a peak current, and all the peak counters 12 are unavailable again.

The methods in FIGS. 25 and 27 are compared with each other.

In the method in FIG. 25, the patrolling is continued until any one of the peak counters 12 becomes available again. For this reason, the method in FIG. 25 is preferably adopted in combination with the priority control according tis the ninth embodiment. However, no progress may be made in an operation for a long time as in the third memory chip 2c in FIG. 25.

In the method in FIG. 27, a priority is given to the memory chip 2 the peak wait state of which is first detected after all the peak counters 12 become unavailable. Therefore, a situation in which no progress is made in an operation for a long time is unlikely to occur. However, since the patrolling is stopped in the method in FIG. 27, the priority control is not applied to a peak wait state generated after the stop.

Therefore, when either the method in FIG. 25 or the method in FIG. 27 is adopted, it is desirable that the principle of the adaptation is determined in light of these advantages.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of controlling a semiconductor storage device including a plurality of memory chips and a control chip, the method comprising:
   receiving a first command to a first memory chip in the memory chips;
   performing a first operation in accordance with the first command;
   receiving a second command to a second memory chip in the memory chips during the first operation;
   starting a second operation in accordance with the second command;
   shifting the second memory chip to a first wait state during the second operation;
   restarting the second operation; and
   controlling a total peak current generated from the memory chips by sequentially patrolling the memory chips.

2. The method of claim 1, wherein
   the first operation is regarding a program operation, a read operation or an erase operation, and the second operation comprises a program operation a read operation or an erase operation.

3. The method of claim 1, wherein
   the first and the second operations are regarding program operations.

4. The method of claim 1, wherein
   the control chip patrols the memory chips after receiving the first command to the first memory chip.

5. The method of claim 1, wherein
   the shifting the second memory chip to the first wait state is in accordance with a first instruction by the control chip; and
   the restarting the second operation is in accordance with a second instruction by the control chip.

6. The method of claim 1, further comprising:
   generating a first peak current from the first memory chip during the first operation, and
   generating a second peak current from the second memory chip after restarting the second operation.

7. The method of claim 6, further comprising:
   the first peak current and the second peak current are not overlapped with each other.

8. The method of claim 1, wherein
   the controlling the total peak current includes setting a reference value,
   searching states of the memory chips by the patrolling, and
   checking whether search results reach the reference value.

9. The method of claim 8, wherein
   the reference value is regarding overlapping peak currents.

10. The method of claim 8, wherein
    the reference value is a number of memory chips in a busy state.

11. The method of claim 8, wherein
    the search results reach the reference value before shifting the second memory chip to the first wait state.

12. The method of claim 1, further comprising:
    receiving a third command to a third memory chip in the memory chips during the first operation and before receiving the second command; and
    performing a third operation in accordance with the third command,
    wherein
    the third operation is regarding a program operation, a read operation or an erase operation.

13. The method of claim 12, wherein
the first, the second and the third operations are regarding program operations.
14. The method of claim 12, further comprising:
generating a third peak current from the third memory chip during the third operation,
wherein
the first peak current and the third peak current are overlapped with each other.
15. The method of Claim 12, further comprising:
shifting the second memory chip to the first wait state during the first and the third operations.
16. The method of claim 12, further comprising:
shifting the third memory chip to a second wait state during the third operation; and
restarting the third operation.
17. The method of claim 16, further comprising:
shifting the third memory chip to the second wait state during the first and the second operations.
18. The method of claim 16, wherein
a time period of the first wait state is different from a time period of the second wait state.
19. method of claim 1, wherein
controlling the total peak current is in accordance with a third command regarding operation mode change.
20. The method of Claim 1, wherein
one of the memory chips includes TSV electrodes provided to electrically connect the memory chips that are stacked on one another, and
micro bumps are provided on a rewiring layer of the one of the memory chips.

* * * * *